United States Patent
Funaya et al.

(10) Patent No.: US 6,515,869 B2
(45) Date of Patent: *Feb. 4, 2003

(54) SUPPORTING SUBSTRATE FOR A SEMICONDUCTOR BARE CHIP

(75) Inventors: Takuo Funaya, Tokyo (JP); Koji Matsui, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/519,888

(22) Filed: Mar. 6, 2000

(65) Prior Publication Data

US 2002/0092610 A1 Jul. 18, 2002

Related U.S. Application Data

(62) Division of application No. 09/083,968, filed on May 26, 1998, now Pat. No. 6,042,682.

(30) Foreign Application Priority Data

May 26, 1997 (JP) .............................................. 9-135348

(51) Int. Cl.⁷ ............................................... H01L 21/60
(52) U.S. Cl. ......................... 361/768; 361/783; 257/783
(58) Field of Search ................................. 361/760, 767, 361/768, 770, 771, 783; 174/255, 259, 260; 257/778, 783; 438/108; 29/832, 840

(56) References Cited

U.S. PATENT DOCUMENTS

| 4,972,250 A | | 11/1990 | Omori et al. |
| 5,384,952 A | | 1/1995 | Matsui |
| 5,523,628 A | * | 6/1996 | Williams et al. ............. 257/778 |
| 5,611,140 A | | 3/1997 | Kulesza et al. |
| 5,830,563 A | | 11/1998 | Shimoto et al. |
| 5,873,161 A | * | 2/1999 | Chen et al. ................... 29/830 |
| 6,124,631 A | * | 9/2000 | Cardot et al. ................ 257/667 |

FOREIGN PATENT DOCUMENTS

| JP | 61-58248 | 3/1986 |
| JP | 2-256252 | 10/1990 |
| JP | 379063 | 4/1991 |
| JP | 3-84026 | 4/1991 |
| JP | 4/58542 | 2/1992 |
| JP | 4-58542 | 2/1992 |
| JP | 7-283269 | 10/1995 |

* cited by examiner

Primary Examiner—Jeff H. Aftergut
Assistant Examiner—John T. Haran
(74) Attorney, Agent, or Firm—Young & Thompson

(57) ABSTRACT

A supporting substrate for mounting a semiconductor bare chip thereon has a surface provided with electrode pads thereon and bumps on the electrode pads. A sealing resin film is selectivley formed on the periphery of the surface of the supporting substrate, except over the bumps, and further the sealing resin film has at least a thermosetting property. The electrode pads of the supporting substrate and the bumps of the semiconductor bare chip are bonded by a thermo-compression bonding.

12 Claims, 25 Drawing Sheets

SUPPORTING SUBSTRATE FOR A SEMICONDUCTOR BARE CHIP

CROSS-REFERENCE TO RELATED APPLICATIONS

This application is a division of application Ser. No. 09/083,968, filed May. 26, 1998, now U.S. Pat. No. 6,042,682.

BACKGROUND OF THE INVENTION

The present invention relates to a supporting substrate to be bonded with a semiconductor bare chip and a method of bonding a supporting substrate and a semiconductor bare chip.

In prior art, after bumps have been provided on the semiconductor bare chip, then the semiconductor bare chip is face-down bonded onto the supporting substrate by a thermal compression bonding process. Thereafter, a sealing resin is flowed into an inter-space between the semiconductor bare chip and the supporting substrate for sealing them.

With reference to FIG. 1A, electrode pads 3 are provided on a supporting substrate 1. Further, electrode pads 3 are also provided on a semiconductor bare chip 6 and then bumps 4 are provided on the electrode pads 3 of the semiconductor bare chip 6.

With reference to FIG. 1B, the semiconductor bare chip 6 and the supporting substrate 1 are bonded by the thermo-compression bonding so that the bumps 4 of the semiconductor bare chip 6 are bonded with the electrode pads 3 of the supporting substrate 1.

With reference to FIG. 1C, a sealing resin 5 is flowed into an inter-space between the semiconductor bare chip 6 and the supporting substrate 1 for sealing the same.

Further, it is disclosed in Japanese laid-open patent publication No. 8-213425 that bumps are provided on electrode pads formed on both the semiconductor bare chip and the supporting substrate prior to the thermocompression bonding between them before the sealing resin is flowed into an inter-space between the semiconductor bare chip and the supporting substrate for sealing the same.

Furthermore, the tape-automated bonding method as the other type bonding than the face-down bonding method is disclosed in Japanese laid-open patent publication No. 5-36761.

The conventional thermocompression bonding is engaged with the following disadvantages. It is required to conduct the previous treatment or process of the semiconductor bare chip before bonding thereof to the supporting substrate. Namely, the semiconductor bare chip is not directly usable for bonding to the supporting substrate. This causes a problem with entry of defects and impurities into the semiconductor bare chip. Further, the sealing resin film is flowed into the inter-space between the semiconductor bare chip and the supporting substrate after the bonding process has been carried out, for which reason it is difficult to conduct an exact sealing between the semiconductor bare chip and the supporting substrate without formation of any voids in the sealing resin film. This results in deterioration or drop of reliability of the product of the semiconductor device.

In the above circumstances, it had been required to develop a novel supporting substrate to be bonded with a semiconductor bare chip and a novel method of bonding them free from the above problems and disadvantages.

SUMMARY OF THE INVENTION

Accordingly, it is an object of the present invention to provide a novel supporting substrate to be bonded with a semiconductor bare chip free from the above problems.

It is a further object of the present invention to provide a novel supporting substrate to be bonded with a semiconductor bare chip without conducting any previous treatment or process of the semiconductor bare chip before bonding thereof to the supporting substrate.

It is a still further object of the present invention to provide a novel supporting substrate to be bonded with a semiconductor bare chip which allows prevention of entry of defects and impurities into the semiconductor bare chip.

It is yet a further object of the present invention to provide a novel supporting substrate to be bonded with a semiconductor bare chip without flowing a sealing resin into an inter-space between the semiconductor bare chip and the supporting substrate after the bonding process has been carried out.

It is a further object of the present invention to provide a novel supporting substrate to be bonded with a semiconductor bare chip which allows conducting an exact sealing between the semiconductor bare chip and the supporting substrate without formation of any voids in the sealing resin film.

It is a still further object of the present invention to provide a novel supporting substrate to be bonded with a semiconductor bare chip which allows the product of the semiconductor device to have a high reliability.

It is moreover an object of the present invention to provide a novel method of thermocompression bonding a supporting substrate to a semiconductor bare chip free from the above problems.

It is another object of the present invention to provide a novel method of thermocompression bonding a supporting substrate to a semiconductor bare chip which prevents entry of defects and impurities into the semiconductor bare chip.

It is still another object of the present invention to provide a novel method of thermocompression bonding between a supporting substrate to and a semiconductor bare chip without conducting any previous treatment or process of the semiconductor bare chip before bonding thereof to the supporting substrate.

It is yet another object of the present invention to provide a novel method of thermocompression bonding a supporting substrate to a semiconductor bare chip without flowing a sealing resin into an inter-space between the semiconductor bare chip and the supporting substrate after the bonding process has been carried out.

It is further another object of the present invention to provide a novel method of thermocompression bonding between a supporting substrate and a semiconductor bare chip which allows conducting an exact sealing between the semiconductor bare chip and the supporting substrate without formation of any voids in the sealing resin film.

It is an additional object of the present invention to provide a novel method of thermocompression bonding a supporting substrate to a semiconductor bare chip without any deterioration or drop of reliability of the product of the semiconductor device.

The above and other objects, features and advantages of the present invention will be apparent from the following descriptions.

The first aspect of the present invention provides a supporting substrate for mounting a semiconductor bare chip thereon. The supporting substrate has a surface provided with electrode pads thereon and bumps on the electrode pads. A sealing resin film is selectively formed on the surface of the supporting substrate, except over the bumps, and further the sealing resin film has at least a thermosetting property. The electrode pads of the above supporting substrate and the bumps of the semiconductor bare chip are bonded by a thermo-compression bonding method whereby the sealing between the supporting substrate and the semiconductor bare chip is simultaneously conducted.

The second aspect of the present invention provides a semiconductor device comprising: a semiconductor bare chip having a surface provided with first electrode pads thereon; and a supporting substrate on which the semiconductor bare chip is mounted. The supporting substrate has a surface provided with second electrode pads thereon and bumps on the second electrode pads so as to bond the bumps with the first electrode pads of the semiconductor bare chip. The surface of the supporting substrate, except for the bumps, is covered by a sealing resin film. The sealing resin film has at least a thermosetting property.

The third aspect of the present invention provides a method of bonding a semiconductor bare chip to a supporting substrate. The method comprises a single step of: conducting a thermo-compression bonding of the semiconductor bare chip having a surface, which is provided with first electrode pads thereon, to a supporting substrate having a surface, which is provided with second electrode pads thereon and bumps on the second electrode pads and which is covered by a sealing resin film having both a photosensitivity and a thermosetting property, so that the bumps are bonded with the first electrode pads of the semiconductor bare chip.

The fourth aspect of the present invention provides a method of forming a supporting substrate for mounting a semiconductor bare chip thereon. The method comprises the steps of: providing electrode pads on a surface of the supporting substrate; providing bumps on the electrode pads; and selectively providing a sealing resin film having both a photosensitivity and a thermosetting property on the surface of the supporting substrate, except over the bumps.

The fifth aspect of the present invention provides a method of forming a semiconductor device. The method comprises the steps of: providing electrode pads on a surface of a supporting substrate; providing bumps on the electrode pads; selectively providing a sealing resin film having both a photosensitivity and a thermosetting property on the surface of the supporting substrate, except over the bumps; and conducting a thermo-compression bonding of the supporting substrate with a semiconductor bare chip having a surface which is provided with first electrode pads thereon and which is entirely covered by a passivation layer except over the electrode pads, so that the bumps are bonded with the first electrode pads of the semiconductor bare chip, and the sealing resin film is made into contact directly with the passivation layer of the semiconductor bare chip.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1A:
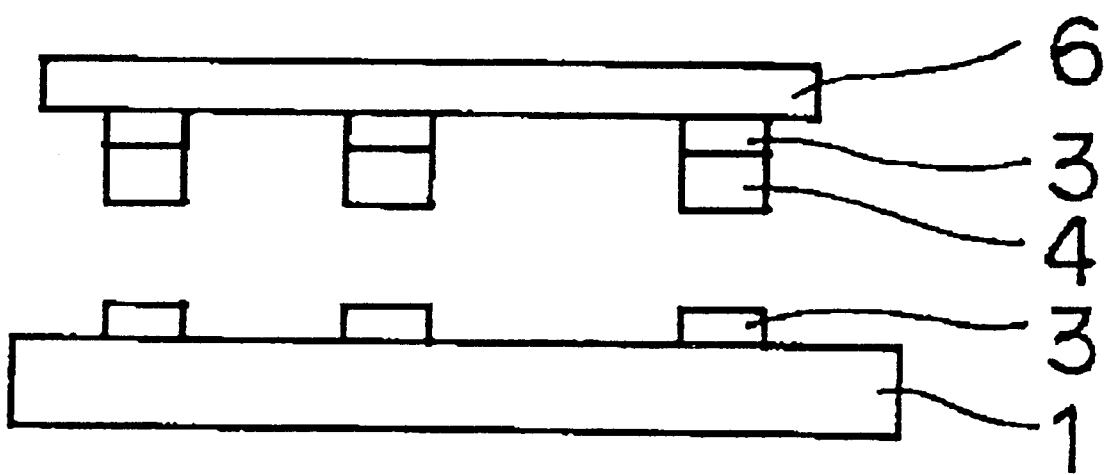
FIGS. 1A through 1C are illustrative of the conventional bonding method of a thermocompression bonding between a supporting substrate and a semiconductor bare chip.
Figure 1B:
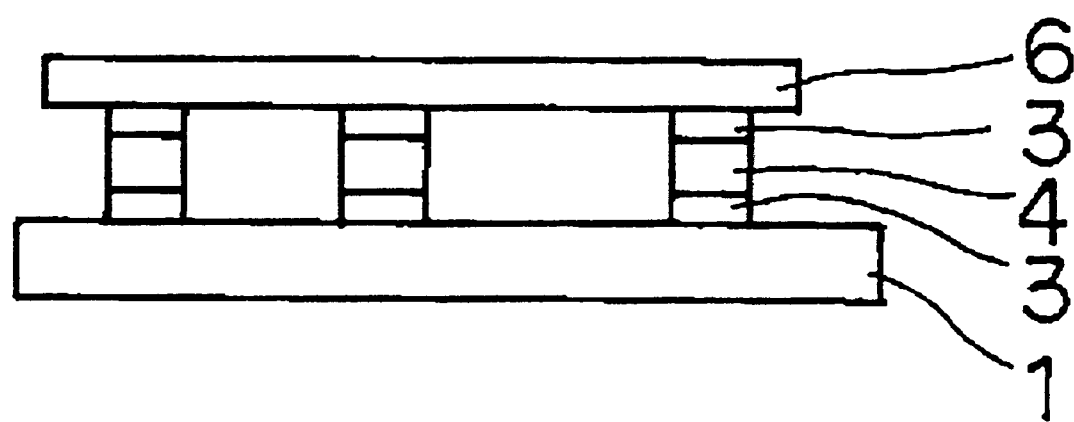
Figure 1C:
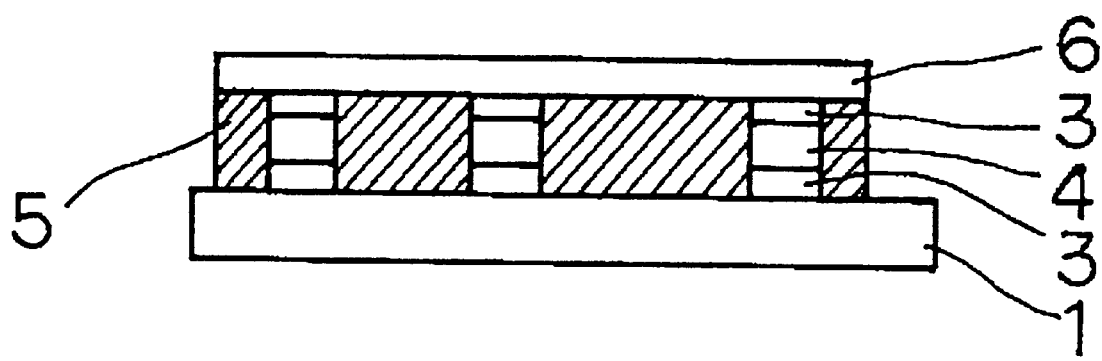

The first aspect of the present invention provides a supporting substrate for mounting a semiconductor bare chip thereon. The supporting substrate has a surface provided with electrode pads thereon and bumps on the electrode pads. A sealing resin film is selectively formed on the surface of the supporting substrate, except over the bumps, and further the sealing resin film has at least a thermosetting property. The electrode pads of the above supporting substrate and the bumps of the semiconductor bare chip are bonded by a thermo-compression bonding method whereby the sealing between the supporting substrate and the semiconductor bare chip is simultaneously conducted. Contrary to the above conventional bonding between the supporting substrate and the semiconductor bare chip, in accordance with the first aspect, there is no need to conduct any previous treatment or process of the semiconductor bare chip before bonding thereof to the supporting substrate. Namely, the semiconductor bare chip is usable for bonding to the supporting substrate. This avoids entry of defects and impurities into the semiconductor bare chip. Further, in accordance with the present invention, the sealing resin film has previously and selectively be formed on the supporting substrate before the semiconductor bare chip is bonded to the supporting substrate whereby the sealing between the supporting substrate and the semiconductor bare chip are simultaneously bonded. There is no possibility of forming any voids in the sealing resin film, Since the sealing resin film has the thermosetting property, the sealing resin film can securely be bonded with the semiconductor bare chip by the thermocompression bonding method. Various type bumps such as stud bumps, ball bumps and plating bumps are available.

It is preferable that the sealing resin film has a photosensitivity. This allows that the sealing resin film is selectively and accurately formed by patterning thereof with exposure and subsequent development for application to the semiconductor bare chip having a high density integration of fine semiconductor devices.

It is also preferable that the sealing resin film extends over an entire surface region corresponding to an entire part of the semiconductor bare chip, except over the bumps.

It is also preferable that the sealing resin film selectively extends over a peripheral surface region corresponding to a peripheral part of the semiconductor bare chip, except over the bumps.

It is also preferable that the sealing resin film includes: an activation energy ray thermosetting resin which exhibits a thermosetting phenomenon by irradiation of an activation energy ray having an activation energy; an activation energy ray polymerization initiator which generates radicals by irradiation of the activation energy ray; a diluent; and a thermosetting compound having an epoxy group. In this case, it is preferable that the activation energy ray includes at least any one of ultraviolet rays, electron beams and X-rays. Alternatively, it is also preferable that the activation energy ray thermosetting resin comprises an epoxy resin having a fluorene skeleton structure lamely, the activation energy ray thermosetting resin may comprise an epoxyacrylate resin having a fluorenyl group skeleton structure. The activation energy ray thermosetting resin may be obtained by an esterification reaction of an epoxy resin with an unsaturated basic acid at an equivalent ratio in the range 0.5 to 1.5 of the unsaturated basic acid to the epoxy resin. Available epoxy resins are, for example, phenolnovolak type epoxy resins, cresolnovolak type epoxy resins, glycidylamine type epoxy resins, biphenyl type epoxy resins, epoxy resins having the fluorene skeleton structure and epoxy resins of bromides thereof. Available unsaturated basic acids are, for example, an acrylic acid, a mothacrylic acid, a crotonic acid, a maleic acid, a monomethyl maleic acid, a monopropyl maleic acid, a monobutyl maleic acid, and a sorbic acid. Particularly, the acrylic acid is preferable. An epoxy acrylate having the fluorenyl group skeleton structure is particularly preferable which may be obtained by reacting (metha)acrylate with an epoxy resin having the fluorene skeleton structure and epoxy resin of bromide thereof. The epoxy resins having the fluorene skeleton structure are disclosed in Japanese Patent Publication No. 7-91365, on page 3, left column, line 35 to the same page on the right column, line 1. EFS300 commercially available from Shin Nippon Steel, Co., Ltd. is one of the available epoxy resins having the fluorene skeleton structure. If the epoxy resin having the fluorene skeleton structure is superior in properties such as heat resistivity, high surface hardness and large flexibility.

It is possible to conduct an alkali development of the activation energy ray thermosetting resin as obtained above, for which reason it is preferable that this resin is further reacted with polybasic acids such as a phthalic acid, a phthalic anhydride, a maleic acid, a maleic anhydride, an oxalic acid, an adipic acid and a citric acid. In this case, it is preferable that the resin has an acid value in the range of 20–150.

The activation energy ray polymerization initiator generates radicals by irradiation of the activated energy ray thereunto. The activation energy ray polymerization initiators are classified into a first type exhibiting hydrogen absorption reaction and a second type exhibiting radical cleavage reaction. Those properties of the activation energy ray polymerization initiators are capable of promotion of polymerization of the activation energy ray thermosetting resin. A typical one of the first type activation energy ray polymerization initiators is benzophenones. A typical one of the second type activation energy ray polymerization initiators is benzyldimethylketals. Further, thioxanthone system compounds art also available. There are, for example, available benzophenone, 4,4'-dimethylaminobenzophenone, 4,4'-diethylaminobenzophenone, 2-ethylanthraquinone, tert-butylanthraquinone, benzoinethylether, benzoinisopropylether, 2,2-dimethoxy-2-phenylacetophenone, 2,2-diethoxy-acetophenone, 2-chlorothioxanthone, diethyl-thioxanthone, 2-hydroxy-2-methyl-propiophenone and 4-isopropyl-2-hydroxy-2-methyl-propiophenone. In this case, it is further preferable that one or more kinds of the activation energy ray polymerization initiator are present at a ratio in the range of 3–20% by weight to the activation energy ray thermosetting resin.

As the above diluent, photopolymerization monomers or organic solvents. The photopolymerization monomers are classified into water-soluble monomers and water-insoluble monomers. Typical water-soluble photopolymerization monomers are, for example, 2-hydroxyethylacrylate, 2-hydroxypropylacrylate, N-vinylpyrolidone, acryloylmorpholine, methoxy-tetraethyleneglycolacrylate, methoxy-polyethyleneglycolacrylate, polyethyleneglycoldiacrylate, N,N'-dimethylacrylamide, N-methylolacrylamide, N,N-dimethylaminopropylacrylamide, N,N-dimethylaminoethylacrylate, N,N-dimethylaminopropylacrylate, melamine-acrylate and methacrylates which correspond to the above acrylates. Typical water-insoluble photopolymerization monomers are, for example, diethyleneglycoldiacrylate, triethyleneglycoldiacrylate, propylene-glycoldiacrylate, dipropyleneglycoldiacrylate, tripropyleneglycoldiacrylate, polypropyleneglycoldiacrylate, phenoxyethylacrylate, tertahydrofurfurylacrylate, dicyclohexylacrylate, trimethylolpropane-diacrylate, trimethylolpropane-triacrylate, glycerol digylcidylether-diacrylate, glycerol trigylcidylethertriacrylate, pentaerythlytoltriacrylate, di-penta-erythlytol-penta-acrylate, di-penta-erythlytol-hexa-acrylate, isoborneorylacrylate, cyclopentadieneacrylate, cyclopentadienediacrylate, methacrylates corresponding to the above acrylates, anti mono-, di- or tri-polyesters of polybasic acids and hydroxyalkyl(metha)acrylate.

It is also preferable that the co-polymerization monomers are present at a ratio in the range of 10–60% by weight to the activation energy ray thermosetting resin. It is further preferable that the co-polymerization monomers are present at a ratio in the range of 20–40% by weight to the activation energy ray thermosetting resin.

The above activation energy ray thermosetting resin is dissolved in use in the organic solvent as dilution for application onto the supporting substrate. Available organic solvents are, for example, ethyleneglycolmonoethylether, ethyleneglycolmonoethyletheracetate, ethyleneglycolmonobutylether, ethyleneglycolmonobutyletheracetate, propyleneglycolmonomethylether, propyleneglycolmonomethylether-acetate, methylethylketone, methylisobutylketone, 1,1,1-trichloroethane, and trichloroethylene, or mixtures thereof.

Further, the thermosetting compounds such as a phenolnovolak type epoxy resin, a cresol novolak type epoxy resin and a bis-phenol A-type epoxy resin are available for improvement of adhesion to the supporting substrate. It is also preferable that this thermosetting compound is present at a ratio in the range of 5–40% by weight to the activation energy ray thermosetting resin. It is further preferable that the thermosetting compound is present at a ratio in the range of 10–30% by weight to the activation energy ray thermosetting resin.

The second aspect of the present invention provides a semiconductor device comprising: a semiconductor bare chip having a surface provided with first electrode pads thereon; and a supporting substrate on which the semiconductor bare chip is mounted. The supporting substrate has a surface provided with second electrode pads thereon and bumps on the second electrode pads so as to bond the bumps with the first electrode pads of the semiconductor bare chip. The surface of the supporting substrate, except for the bumps, is covered by a sealing resin film. The sealing resin film has at least a thermosetting property. Contrary to the above conventional bonding between the supporting substrate and the semiconductor bare chip, in accordance with the second aspect of the present invention, there is no need to conduct any previous treatment or process of the semiconductor bare chip before bonding thereof to the supporting substrate. Namely, the semiconductor bare chip is usable for bonding to the supporting substrate. This avoids entry of defects and impurities into the semiconductor bare chip. Further, in accordance with the present invention, the sealing resin film has previously and selectively be formed on the supporting substrate before the semiconductor bare chip is bonded to the supporting substrate whereby the sealing between the supporting substrate and the semiconductor bare chip are simultaneously bonded. There is no possibility of forming any voids in the sealing resin film. Since the sealing resin film has the thermosetting property, the sealing resin film can securely be bonded with the semiconductor bare chip by the thermo-compression bonding method. Various type bumps such as stud bumps, ball bumps and plating bumps are available.

It is preferable that the surface of the semiconductor bare chip is entirely covered by a passivation layer except over the electrode pads so as to contact the sealing resin film directly with the passivation layer of the semiconductor bare chip.

It is also preferable that the surface of the semiconductor bare chip except for the electrode pads is in contact directly with the sealing resin film.

It is also preferable that the sealing resin film has a photosensitivity. This allows that the sealing resin film is selectively and accurately formed by patterning thereof with exposure and subsequent development for application to the semiconductor bare chip having a high density integration of fine semiconductor devices.

It is also preferable that the sealing resin film extends over an entire surface region corresponding to an entire part of the semiconductor bare chip, except over the bumps.

It is also preferable that the sealing resin film selectively extends over a peripheral surface region corresponding to a peripheral part of the semiconductor bare chip, except over the bumps.

It is also preferable that the sealing resin film includes an activation energy ray thermosetting resin which exhibits a thermosetting phenomenon by irradiation of an activation energy ray having an activation energy; an activation energy ray polymerization initiator which generates radicals by irradiation of the activation energy ray; a diluent; and a thermosetting compound having an epoxy group. In this case, it is also preferable that the activation energy ray includes at least any one of ultraviolet rays, electron beams and X-rays. It is also preferable that the activation energy ray thermosetting resin comprises an epoxy resin having a fluorene skeleton structure. It is also preferable that the activation energy ray thermosetting resin comprises an epoxyacrylate resin having a fluorenyl group skeleton structure. It is also preferable that the activation energy ray polymerization initiator is present at a ratio in the range of 3–20% by weight to the activation energy ray thermosetting resin. It is also preferable that the diluent is present at a ratio in the range of 10–60% by weight to the activation energy ray thermosetting resin. It is further preferable that the diluent is present at a ratio in the range of 20–40% by weight to the activation energy ray thermosetting resin. It is also preferable that the thermosetting compound is present at a ratio in the range of 5–40% by weight to the activation energy ray thermosetting resin. It is further preferable that the thermosetting compound is present at a ratio in the range of 10–30% by weight to the activation energy ray thermosetting resin.

The third aspect of the present invention provides a method of bonding a semiconductor bare chip to a supporting substrate. The method comprises a single step of: conducting a thermo-compression bonding of the semiconductor bare chip having a surface, which is provided with first electrode pads thereon, to a supporting substrate having a surface, which is provided with second electrode pads thereon and bumps on the second electrode pads and which is covered by a sealing resin film having both a photosensitivity and a thermosetting property, so that the bumps are bonded with the first electrode pads of the semiconductor bare chip. Contrary to the above conventional bonding between the supporting substrate and the semiconductor bare chip, in accordance with the first aspect of the present invention, there is no need to conduct any previous treatment or process of the semiconductor bare chip before bonding thereof to the supporting substrate. Namely, the semiconductor bare chip is usable for bonding to the supporting substrate. This avoids entry of defects and impurities into the semiconductor bare chip. Further, in accordance with the present invention, the sealing resin film has previously and selectively be formed on the supporting substrate before the semiconductor bare chip is bonded to the supporting substrate whereby the sealing between the supporting substrate and the semiconductor bare chip are simultaneously bonded. There is no possibility of forming any voids in the sealing resin film. Since the sealing resin film has the thermosetting property, the sealing resin film can securely be bonded with the semiconductor bare chip by the thermocompression bonding method. Further, the sealing resin film has the photosensitivity. This allows that the sealing resin film is selectively and accurately formed by patterning thereof with exposure and subsequent development for application to the semiconductor bare chip having a high density integration of fine semiconductor devices. Various type bumps such as stud bumps, ball bumps and plating bumps are available.

It is also preferable that the surface of the semiconductor bare chip, is entirely covered by a passivation layer except over the first electrode pads, so that the sealing resin film is made into contact directly with the passivation layer of the semiconductor bare chip.

It is also preferable that the surface of the semiconductor bare chip is made into contact directly with the sealing resin film. In this case, it is also preferable that the sealing resin film extends over an entire surface region corresponding to an entire part of the semiconductor bare chip, except over the bumps, so that the bumps are bonded with the first electrode pads of the semiconductor bare chip, and an entire part of the sealing resin film is made into contact directly with the semiconductor bare chip.

It is also preferable that the sealing resin film selectively extends over a peripheral surface region corresponding to a peripheral part of the semiconductor bare chip, except over the bumps, so that the bumps are bonded with the first electrode pads of the semiconductor bare chip, and an entire part of the sealing resin film is made into contact directly with a peripheral part of the passivation layer of the semiconductor bare chip.

It is also preferable that the sealing resin film includes: an activation energy ray thermosetting resin which exhibits a thermosetting phenomenon by irradiation of an activation energy ray having an activation energy; an activation energy ray polymerization initiator which generates radicals by irradiation of the activation energy ray; a diluent; and a thermosetting compound having an epoxy group. It is also preferable that the activation energy ray includes at least any one of ultraviolet rays, electron beams and X-rays. It is also preferable that the activation energy ray thermosetting resin comprises an epoxy resin having a fluorene skeleton structure. It is also preferable that the activation energy ray thermosetting resin comprises an epoxyacrylate resin having a fluorenyl group skeleton structure. It is also preferable that the activation energy ray polymerization initiator is present at a ratio in the range of 3–20% by weight to the activation energy ray thermosetting resin. It is also preferable that the diluent is present at a ratio in the range of 10–60% by weight to the activation energy ray thermosetting resin. It is further preferable that the diluent is present at a ratio in the range of 20–40% by weight to the activation energy ray thermosetting resin. It is also preferable that the thermosetting compound is present at a ratio in the range of 5–40% by weight to the activation energy ray thermosetting resin. It is further preferable that the thermosetting compound is present at a ratio in the range of 10–30% by weight to the activation energy ray thermosetting resin.

The fourth aspect of the present invention provides a method of forming a supporting substrate for mounting a semiconductor bare chip thereon. The method comprises the steps of: providing electrode pads on a surface of the supporting substrate; providing bumps on the electrode pads; and selectively providing a sealing resin film having both a photosensitivity and a thermosetting property on the surface of the supporting substrate, except over the bumps. Contrary to the above conventional bonding between the supporting substrate and the semiconductor bare chip, in accordance with the fourth aspect of the present invention, there is no need to conduct any previous treatment or process of the semiconductor bare chip before bonding thereof to the supporting substrate. Namely, the semiconductor bare chip is usable for bonding to the supporting substrate. This avoids entry of defects and impurities into the semiconductor bare chip. Further, in accordance with the present invention, the scaling resin film has previously and selectively be formed on the supporting substrate before the semiconductor bare chip is bonded to the supporting substrate whereby the sealing between the supporting substrate and the semiconductor bare chip are simultaneously bonded. There is no possibility of forming any voids in the sealing resin film. Since the sealing resin film has the thermosetting property, the sealing resin film can securely be bonded with the semiconductor bare chip by the thermo-compression bonding method. Further, the sealing resin film has the photosensitivity. This allows that the sealing resin film is selectively and accurately formed by patterning thereof with exposure and subsequent development for application to the semiconductor bare chip having a high density integration of fine semiconductor devices. Various type bumps such as stud bumps, ball bumps and plating bumps are available.

It is preferable that the sealing resin film is provided over an entire surface region corresponding to an entire part of the semiconductor bare chip, except over the bumps.

It is also preferable that the sealing resin film is selectively provided over a peripheral surface region corresponding to a peripheral part of the semiconductor bare chip, except over the bumps.

It is also preferable that the sealing resin film includes: an activation energy ray thermosetting resin which exhibits a thermosetting phenomenon by irradiation of an activation energy ray having an activation energy; an activation energy ray polymerization initiator which generates radicals by irradiation of the activation energy ray; a diluent; and a thermosetting compound having an epoxy group. In this case, it is also preferable that the activation energy ray includes at least any one of ultraviolet rays, electron beams and X-rays. It is also preferable that the activation energy ray thermosetting resin comprises an epoxy resin having a fluorene skeleton structure. It is also preferable that the activation energy ray thermosetting resin comprises an epoxyacrylate resin having a fluorenyl group skeleton structure. It is also preferable that the activation energy ray polymerization initiator is present at a ratio in the range of 3–20% by weight to the activation energy ray thermosetting resin. It is also preferable that the diluent is present at a ratio in the range of 10–60% by weight to the activation energy ray thermosetting resin. It is further preferable that the diluent is present at a ratio in the range of 20–40% by weight to the activation energy ray thermosetting resin. It is also preferable that the thermosetting compound is present at a ratio in the range of 5–40% by weight to the activation energy ray thermosetting resin. It is further preferable that the thermosetting compound is present at a ratio in the range of 10–30% by weight to the activation energy ray thermosetting resin.

It is also preferable that the sealing resin film is selectively provided by the steps of: entirely applying a sealing resin material over the surface of the supporting substrate and over the bumps; and patterning the sealing resin material by exposure and subsequent development by use of a mask so as to form the sealing resin film which covers the surface of the supporting substrate, except over the bumps.

The fifth aspect of the present invention provides a method of forming a semiconductor device. The method comprises the steps of: providing electrode pads on a surface of a supporting substrate; providing bumps on the electrode pads; selectively providing a sealing resin film having both a photosensitivity and a thermosetting property on the surface of the supporting substrate, except over the bumps; and conducting a thermocompression bonding of the supporting substrate with a semiconductor bare chip having a surface which is provided with first electrode pads thereon and which is entirely covered by a passivation layer except over the electrode pads, so that the bumps are bonded with the first electrode pads of the semiconductor bare chip, and the sealing resin film is made into contact directly with the passivation layer of the semiconductor bare chip. Contrary to the above conventional bonding between the supporting substrate and the semiconductor bare chip, in accordance with the fifth aspect of the present invention, there is no need to conduct any previous treatment or process of the semiconductor bare chip before bonding thereof to the supporting substrate. Namely, tho semiconductor bare chip is usable for bonding to the supporting substrate. This avoids entry of defects and impurities into the semiconductor bare chip. Further, in accordance with the present invention, the sealing resin film has previously and selectively be formed on the supporting substrate before the semiconductor bare chip is bonded to the supporting substrate whereby the sealing between the supporting substrate and the semiconductor bare chip are simultaneously bonded. There is no possibility of forming any voids in the sealing resin film. Since the sealing resin film has the thermosetting property, the sealing resin film can securely be bonded with the semiconductor bare chip by the thermo-compression bonding method. Further, the sealing resin film has the photosensitivity. This allows that the sealing resin film is selectively and accurately formed by patterning thereof with exposure and subsequent development for application to the semiconductor bare chip having a high density integration of fine semiconductor devices. Various type bumps such as stud bumps, ball bumps and plating bumps are available.

It is also preferable that the sealing resin film is selectively provided over a peripheral surface region corresponding to a peripheral part of the semiconductor bare chip, except over the bumps.

It is preferable that the sealing resin film is provided over an entire surface region corresponding to an entire part of the semiconductor bare chip, except over the bumps.

It is also preferable that the sealing resin film includes: an activation energy ray thermosetting resin which exhibits a thermosetting phenomenon by irradiation of an activation energy ray having an activation energy; an activation energy ray polymerization initiator which generates radicals by irradiation of the activation energy ray a diluent; and a thermosetting compound having an epoxy group. It is also preferable that the activation energy ray includes at least any one of ultraviolet rays, electron beams and X-rays. It is also preferable that the activation energy ray thermosetting resin comprises an epoxy resin having a fluorene skeleton structure. It is also preferable that the activation energy ray thermosetting resin comprises an epoxyacrylate resin having a fluorenyl group skeleton structure. It is also preferable that the activation energy ray polymerization initiator is present at a ratio in the range of 3–20% by weight to the activation energy ray thermosetting resin. It is also preferable that the diluent is present at a ratio in the range of 10–60% by weight to the activation energy ray thermosetting resin. It is further preferable that the diluent is present at a ratio in the range of 20–40% by weight to the activation energy ray thermosetting resin. It is also preferable that the thermosetting compound is present at a ratio in the range of 5–40% by weight to the activation energy ray thermosetting resin. It is further preferable that the thermosetting compound is present at a ratio in the range of 10–30% by weight to the activation energy ray thermosetting resin.

It is also preferable that the sealing resin film is selectively provided by the steps of: entirely applying a sealing resin material over the surface of the supporting substrate and over the bumps; and patterning the sealing resin material by exposure and subsequent development by use of a mask so as to form the sealing resin film which covers the surface of the supporting substrate, except over the bumps.

FIRST EMBODIMENT

A first embodiment according to the present invention will be described in detail with reference to FIGS. 2A through 2E which are illustrative of a novel bonding method of a thermocompression bonding between a supporting substrate and a semiconductor bare chip. The supporting substrate 1 may, for example, be a printed circuit board, a flexible board, an organic tape board, a glass substrate and a ceramic substrate.

Figure 2A:
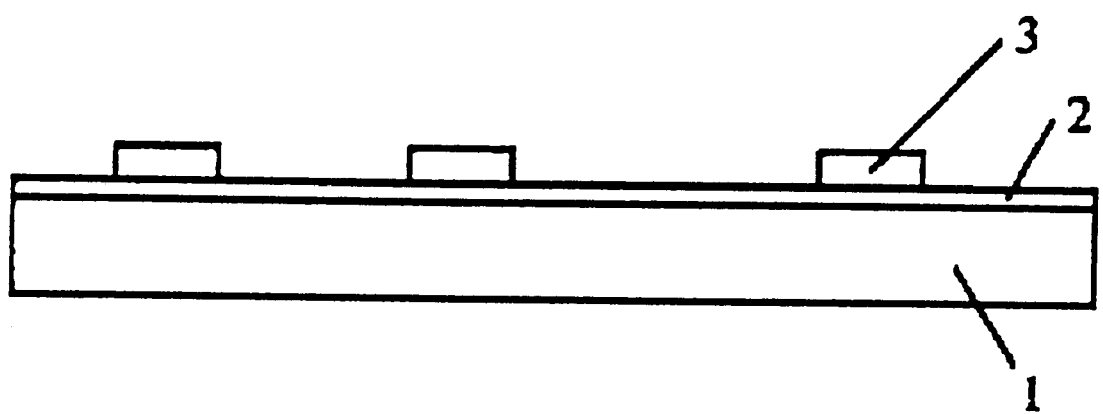
FIGS. 2A through 2E are illustrative of a novel bonding method of a thermocompression bonding between a supporting substrate and a semiconductor bare chip in a first embodiment in accordance with the present invention.

With reference to FIG. 2A, an electrically conductive thin film 2 is formed on an entire surface of the supporting substrate 1 by any available methods such as sputtering method and evaporation methods. A preferable thickness of the electrically conductive thin film 2 may be in the range of about 0.01 micrometer to about 0.1 micrometers. The electrically conductive thin film 2 may comprise laminations of a Ti layer and a Pd layer. Alternatively, the electrically conductive thin film 2 may comprise laminations of a Cr layer and a Pd layer. Further, alternatively, the electrically conductive thin film 2 may comprise laminations of a Cr layer and a Cu layer. A plated resist film is entirely formed on the electrically conductive thin film 2 by any available methods such as a roll coater, a curtain flow coater, a screen printing, and a spin coater. A preferable thickness of the plated resist film may be in the range of 1 micrometer to 100 micrometers. The plated resist film is patterned by exposure and subsequent development, thereby forming interconnection resist patterns over the electrically conductive thin film 2. By use of the interconnection resist patterns, an electro-plating is conducted to selectively form metal interconnection layers on the electrically conductive thin film 2. A preferable thickness of the metal interconnection layers may be in the range of 1 micrometer to 100 micrometers. The metal interconnection layers may be made of any of metals such as Au, Ag or Cu. The plated resist film is then removed by a wet etching which uses a solvent such as MEK or alcohol whereby electrode pads 3 are selectively formed on the electrically conductive thin film 2.

If the printed circuit board, the ceramic substrate, the glass substrate or the semiconductor substrate which has already possessed the interconnections is used but any additional interconnection is required to be formed, then an electrically conductive thin film 2 is formed on an entire surface of the supporting substrate 1 by any available methods such as sputtering method and evaporation methods. A preferable thickness of the electrically conductive thin film 2 may be in the range of about 0.01 micrometer to about 0.1 micrometers. The electrically conductive thin film 2 may comprise laminations of a Ti layer and a Pd layer. Alternatively, the electrically conductive thin film 2 may comprise laminations of a Cr layer and a Pd layer. Further, alternatively, the electrically conductive thin film 2 may comprise laminations of a Cr layer and a Cu layer. A plated resist film is entirely formed on the electrically conductive thin film 2 by any available methods such as a roll coater, a curtain flow coater, a screen printing, and a spin coater A preferable thickness of the plated resist film may be in the range of 1 micrometer to 100 micrometers. The plated resist film is patterned by exposure and subsequent development, thereby forming interconnection resist patterns over the electrically conductive thin film 2. By use of the interconnection resist patterns, an electro-plating is conducted to selectively form metal interconnection layers on the electrically conductive thin film 2. A preferable thickness of the metal interconnection layers may be in the range of 1 micrometer to 100 micrometers. The metal interconnection layers may be made of any of metals such as Au, Ag or Cu. The plated resist film is then removed by a wet etching which uses a solvent such as MEK or alcohol whereby electrode pads 3 are selectively formed on the electrically conductive thin film 2.

Figure 2B:
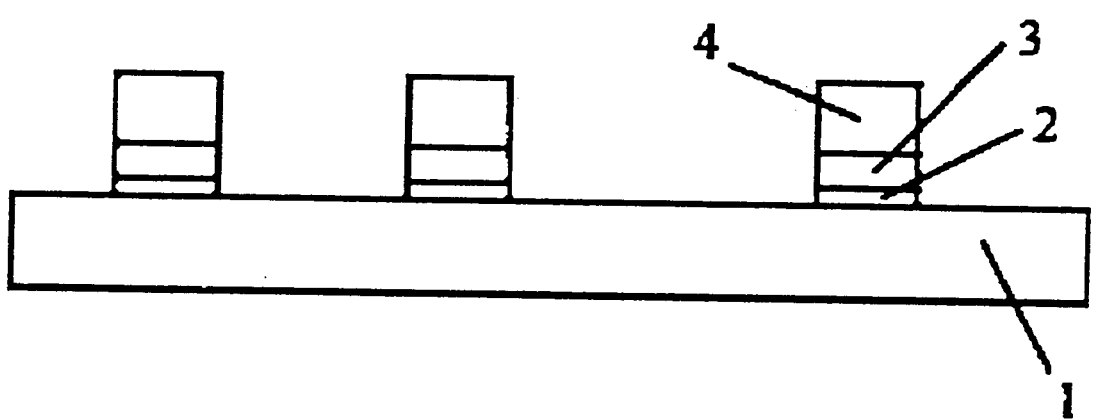

With reference to FIG. 2B, bumps 4 are formed on the electrode pads 3. The bumps 4 may be made of metals or alloys. The bumps 4 may comprise stud bumps, ball bumps, and plated bumps. In order to form Au plated bumps 4 over the electrode pads 3, a newly plated resist film is entirely applied on the substrate 1 to cover the electrode pads 3 and the electrically conductive thin film 2 by any available methods such as a roll coater, a curtain flow coater, a screen printing, and a spin coater. The newly plated resist film is patterned by exposure and subsequent development, thereby forming bump resist patterns. By use of the bump resist patterns, an electro-plating is conducted to selectively form the Au-plated bumps 4. The electro-plating may comprise the steps of a Ni-plating, an Au-strike plating and an Au-plating. It is also possible to form the Cu bumps or the Ag bumps in the same manners. The used bump resist patterns are then removed by the wet etching which uses a solvent such as MEK or alcohol. Further, the electrically conductive thin film 2 is selectively removed by the wet or dry etching process so that the electrically conductive thin film 2 remains only under the electrode pads 3.

Figure 2C:
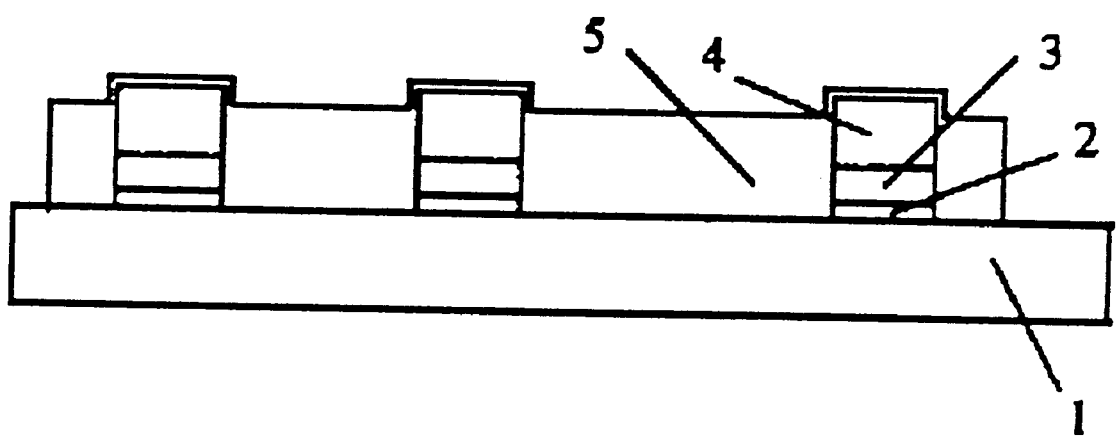

With reference to FIG. 2C, a sealing resin film 5 having both a photo-sensitivity and a thermosetting property is applied on the supporting substrate 1 to cover entirely the surface of the supporting substrate 1 and also cover the bumps 4 by use of any of the available methods using the roll coater, the curtain flow coater and the spin coater. A preferable thickness of the sealing resin film 5 may be in the range of 1 micrometer to 100 micrometers.

Figure 2D:
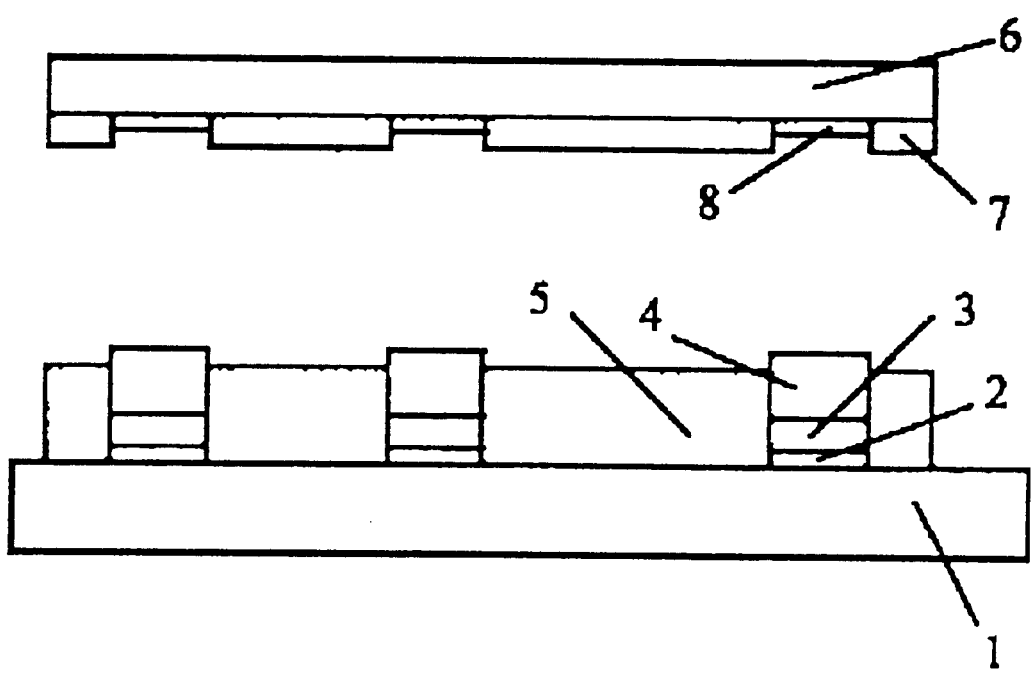

With reference to FIG. 2D, the sealing resin film 5 is then patterned by use of exposure and subsequent development so as to selectively remove the sealing resin film 5 only over the bumps 4 so that the tops of the bumps 4 are shown.

It is also preferable that the sealing resin film includes: an activation energy ray thermosetting resin which exhibits a thermosetting phenomenon by irradiation of an activation energy ray having an activation energy; an activation energy ray polymerization initiator which generates radicals by irradiation of the activation energy ray; a diluent; and a thermosetting compound having an epoxy group. In this case, it is preferable that the activation energy ray includes at least any one of ultraviolet rays, electron beams and X-rays. Alternatively, it is also preferable that the activation energy ray thermosetting resin comprises an epoxy resin having a fluorene skeleton structure. Namely, the activation energy ray thermosetting resin may comprise an epoxyacrylate resin having a fluorenyl group skeleton structure. The activation energy ray thermosetting resin may be obtained by an esterification reaction of an epoxy resin with an unsaturated basic acid at an equivalent ratio in the range 0.5 to 1.5 of the unsaturated basic acid to the epoxy resin. Available epoxy resins are, for example, phenolnovolak type epoxy resins, cresolnovolak type epoxy resins, glycidylamine type epoxy resins, biphenyl type epoxy resins, epoxy resins having the fluorene skeleton structure and epoxy resins of bromides thereof. Available unsaturated basic acids are, for example, an acrylic acid, a methacrylic acid, a crotoric acid, a maleic acid, a monomethyl maleic acid, a monopropyl maleic acid, a monobutyl maleic acid, and a sorbic acid. Particularly, the acrylic acid is preferable. An epoxy acrylate having the fluorenyl group skeleton structure is particularly preferable which may be obtained by reacting (metha)acrylate with an epoxy resin having the fluorene skeleton structure and epoxy resin of bromide thereof. The epoxy resins having the fluorene skeleton structure are disclosed in Japanese Patent Publication No. 7-91365, on page 3, left column, line 35 to the same page on the right column, line 1. EFS300 commercially available from Shin Nippon Steel, Co., Ltd. is one of the available epoxy resins having the fluorene skeleton structure. If the epoxy resin having the fluorene skeleton structure is superior in properties such as heat resistivity, high surface hardness and large flexibility.

It is possible to conduct an alkali development of the activation energy ray thermosetting resin as obtained above, for which reason it is preferable that this resin is further reacted with polybasic acids such as a phthalic acid, a phthalic anhydride, a maleic acid, a maleic anhydride, an oxalic acid, an adipic acid and a citric acid. In this case, it is preferable that the resin has an acid value in the range of 20–150.

The activation energy ray polymerization initiator generates radicals by irradiation of the activated energy ray thereunto. The activation energy ray polymerization initiators are classified into a first type exhibiting hydrogen absorption reaction and a second type exhibiting radical cleavage reaction. Those properties of the activation energy ray polymerization initiators are capable of promotion of polymerization of the activation energy ray thermosetting resin. A typical one of the first type activation energy ray polymerization initiators is benzophenones. A typical one of the second type activation energy ray polymerization initiators is benzyldimethylketals. Further, thioxanthone system compounds are also available. There are, for example, available benzophenone, 4,4'-dimethylaminobenzophenone, 4,4'-diethylaminobenzophenone, 2-ethylanthraquinone, tert-butylanthraquinone, benzoinethylether, benzoinisopropylether, 2,2-dimethoxy-2-phenylacetophenone, 2,2-diethoxy-acetophenone, 2-chlorothioxanthone, diethyl-thioxanthone, 2-hydroxy-2-methyl-propiophenone and 4-isopropyl-2-hydroxy-2-methyl-propiophenone. In this case, it is further preferable that one or more kinds of the activation energy ray polymerization initiator are present at a ratio in the range of 3–20% by weight to the activation energy ray thermosetting resin.

As the above diluent, photopolymerization monomers or organic solvents. The photopolymerization monomers are classified into water-soluble monomers and water-insoluble monomers. Typical water-soluble photopolymerization monomers are, for example, 2-hydroxyethylacrylate, 2-hydroxypropylacrylate, N-vinylpyrolidone, acryloylmorpholine, methoxy-tetraethyleneglycolacrylate, methoxy-polyethyleneglycolacrylate, polyethyleneglycoldiacrylate, N,N'-dimethylacrylamide, N-methylolacrylamide, N,N-dimethylaminopropylacrylamide, N,N-dimethylaminoethylacrylate, N,N-dimethylaminopropylacrylate, melamine-acrylate and methacrylates which correspond to the above acrylates. Typical water-insoluble photopolymerization monomers are, for example, diethyleneglycoldiacrylate, triethyleneglycoldiacrylate, propyleneglycoldiacrylate, dipropyleneglycoldiacrylate, tripropyleneglycoldiacrylate, polypropyleneglycoldiacrylate, phenoxyethylacrylate, tertahydrofurfurylacrylate, dicyclohexylacrylate, trimethylolpropanediacrylate, trimethylolpropane-triacrylate, glycerol digylcidyletherdiacrylate, glycerol trigylcidylethertriacrylate, pentaerythlytoltriacrylate, di-penta-erythlytol-penta-acrylate, di-penta-erythlytol-hexa-acrylate, isoborneorylacrylate, cyclopentadieneacrylate, cyclopentadienediacrylate, methacrylates corresponding to the above acrylates, and mono-, di- or tripolyesters of polybasic acids and hydroxyalkyl(metha)acrylate.

It is also preferable that the co-polymerization monomers are present at a ratio in the range of 10–60% by weight to the activation energy ray thermosetting resin. It is further preferable that the co-polymerization monomers are present at a ratio in the range of 20–40% by weight to the activation energy ray thermosetting resin.

The above activation energy ray thermosetting resin is dissolved in use in the organic solvent as dilution for application onto the supporting substrate. Available organic solvents are, for example, ethyleneglycolmonoethylether, ethyleneglycolmonoethyletheracetate, ethyleneglycolmonobutylether, ethyleneglycolmonobutyletheracetate, propyleneglycolmonomethylether, propyleneglycolmonomethyletheracetate, methylethylketone, methylisobutylketone, 1,1,1-trichloroethane, and trichloroethylene, or mixtures thereof.

Further, the thermosetting compounds such as a phenolnovolak type epoxy resin, a cresol novolak type epoxy resin and a bis-phenol A-type epoxy resin are available for improvement of adhesion to the supporting substrate. It is also preferable that this thermosetting compound is present at a ratio in the range of 5–40% by weight to the activation energy ray thermosetting resin. It is further preferable that the thermosetting compound is present at a ratio in the range of 10–30% by weight to the activation energy ray thermosetting resin.

Figure 2E:
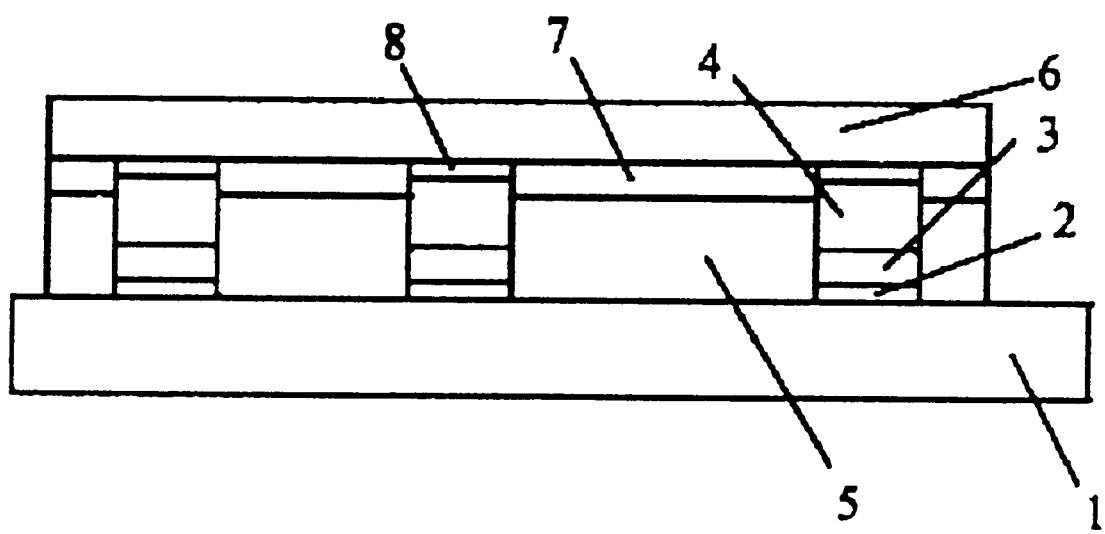

With reference to FIGS. 2D and 2E, there is carried out by use of a mounter a thermocompression bonding between the above supporting substrate already coated with the sealing resin film 3 and a semiconductor bare chip 6 which has already been provided with electrode pads 8 and passivation films 7 so that the bumps 4 of the supporting substrate 1 contact the electrode pads 8 of the semiconductor bare chip 6. In the thermocompression bonding process, the bumps 4 are depressed by the heat given by the thermocompression bonding and also the sealing resin film 4 contacts the passivation films 7 and shows the thermosetting phenomenon due to that heat, whereby the sealing between the supporting substrate 1 and the semiconductor bare chip 6 is completed. The temperature of the thermocompression bonding process is adopted for the material of the sealing resin. Available temperature range may 50° C.–500° C. A pressure of the thermocompression bonding process is determined to avoid that the bumps 4 are extensively depressed and widened to make adjacent two depressed bumps into contact with each other. In the above thermocompression bonding process, the sealing between the supporting substrate 1 and the semiconductor bare chip 6 is completed simultaneously to the bonding between the bumps 4 of the supporting substrate 1 and the electrode pads 4 of the semiconductor bare chip 6.

In accordance with the present invention, there is no need to conduct any previous treatment or process of the semiconductor bare chip before bonding thereof to the supporting substrate. Namely, the semiconductor bare chip is usable for bonding to the supporting substrate. This avoids entry of defects and impurities into the semiconductor bare chip. Further, in accordance with the present invention, the sealing resin film has previously and selectively be formed on the supporting substrate before the semiconductor bare chip is bonded to the supporting substrate whereby the sealing between the supporting substrate and the semiconductor bare chip are simultaneously bonded. There is no possibility of forming any voids in the sealing resin film. Since the sealing resin film has the thermosetting property, the sealing resin film can securely be bonded with the semiconductor bare chip by the thermo-compression bonding method.

Second Embodiment

A second embodiment according to the present invention will be described in detail with reference to FIGS. 3A through 3F which are illustrative of a novel bonding method of a thermocompression bonding between a supporting substrate and a semiconductor bare chip. The supporting substrate 1 may, for example, be a printed circuit board, a flexible board, an organic tape board, a glass substrate and a ceramic substrate.

Figure 3A:
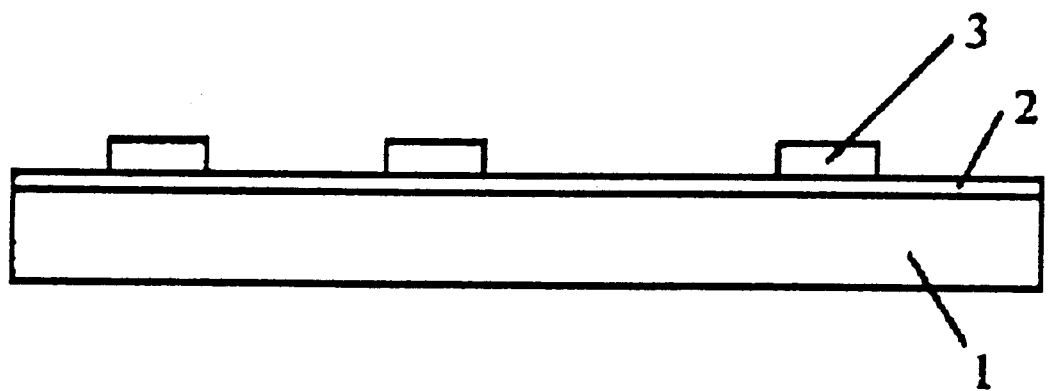
FIGS. 3A through 3F are illustrative of a novel bonding method of a thermocompression bonding between a supporting substrate and a semiconductor bare chip in a second embodiment in accordance with the present invention.

With reference to FIG. 3A, an electrically conductive thin film 2 is formed on an entire surface of the supporting substrate 1 by any available methods such as sputtering method and evaporation methods. A preferable thickness of the electrically conductive thin film 2 may be in the range of about 0.01 micrometer to about 0.1 micrometers. The electrically conductive thin film 2 may comprise laminations of a Ti layer and a Pd layer. Alternatively, the electrically conductive thin film 2 may comprise laminations of a Cr layer and a Pd layer. Further, alternatively, the electrically conductive thin film 2 may comprise laminations of a Cr layer and a Cu layer A plated resist film is entirely formed on the electrically conductive thin film 2 by any available methods such as a roll coater, a curtain flow coater, a screen printing, and a spin coater. A preferable thickness of the plated resist film may be in the range of 1 micrometer to 100 micrometers. The plated resist film is patterned by exposure and subsequent development, thereby forming interconnection resist patterns over the electrically conductive thin film 2. By use of the interconnection resist patterns, an electro-plating is conducted to selectively form metal interconnection layers on the electrically conductive thin film 2. A preferable thickness of the metal interconnection layers may be in the range of 1 micrometer to 100 micrometers. The metal interconnection layers may be made of any of metals such as Au, Ag or Cu. The plated resist film is then removed by a wet etching which uses a solvent such as MEK or alcohol whereby electrode pads 3 are selectively formed on the electrically conductive thin film 2.

If the printed circuit board, the ceramic substrate, the glass substrate or the semiconductor substrate which has already possessed the interconnections is used but any additional interconnection is required to be formed, then an electrically conductive thin film 2 is formed on an entire surface of the supporting substrate 1 by any available methods such as sputtering method and evaporation methods. A preferable thickness of the electrically conductive thin film 2 may be in the range of about 0.01 micrometer to about 0.1 micrometers. The electrically conductive thin film 2 may comprise laminations of a Ti layer and a Pd layer. Alternatively, the electrically conductive thin film 2 may comprise laminations of a Cr layer and a Pd layer, Further, alternatively, the electrically conductive thin film 2 may comprise laminations of a Cr layer and a Cu layer. A plated resist film is entirely formed on the electrically conductive thin film 2 by any available methods such as a roll coater, a curtain flow coater, a screen printing, and a spin coater. A preferable thickness of the plated resist film may be in the range of 1 micrometer to 100 micrometers. The plated resist film is patterned by exposure and subsequent development, thereby forming interconnection resist patterns over the electrically conductive thin film 2. By use of the interconnection resist patterns, an electro-plating is conducted to selectively form metal interconnection layers on the electrically conductive thin film 2. A preferable thickness of the metal interconnection layers may be in the range of 1 micrometer to 100 micrometers. The metal interconnection layers may be made of any of metals such as Au, Ag or Cu. The plated resist film is then removed by a wet etching which uses a solvent such as MEK or alcohol whereby electrode pads 3 are selectively formed on the electrically conductive thin film 2.

Figure 3B:
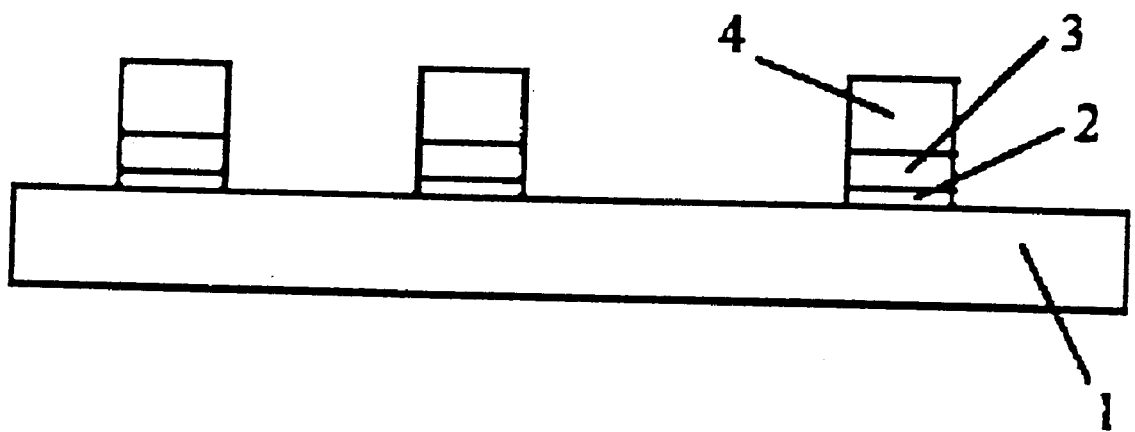

With reference to FIG. 3B, bumps 4 are formed on the electrode pads 3. The bumps 4 may be made of metals or alloys. The bumps 4 may comprise stud bumps, ball bumps, and plated bumps. In order to form Au plated bumps 4 over the electrode pads 3, a newly plated resist film is entirely applied on the substrate 1 to cover the electrode pads 3 and the electrically conductive thin film 2 by any available methods such as a roll coater, a curtain flow coater, a screen printing, and a spin coater. The newly plated resist film is patterned by exposure and subsequent development, thereby forming bump resist patterns. By use of the bump resist patterns, an electro-plating is conducted to selectively form the Au-plated bumps 4. The electro-plating may comprise the steps of a Ni-plating, an Au-strike plating and an Au-plating, It is also possible to form the Cu bumps or the Ag bumps in the same manners. The used bump resist patterns are, then removed by the wet etching which uses a solvent such as MEK or alcohol. Further, the electrically conductive thin film 2 is selectively removed by the wet or dry etching process so that the electrically conductive thin film 2 remains only under the electrode pads 3.

Figure 3C:
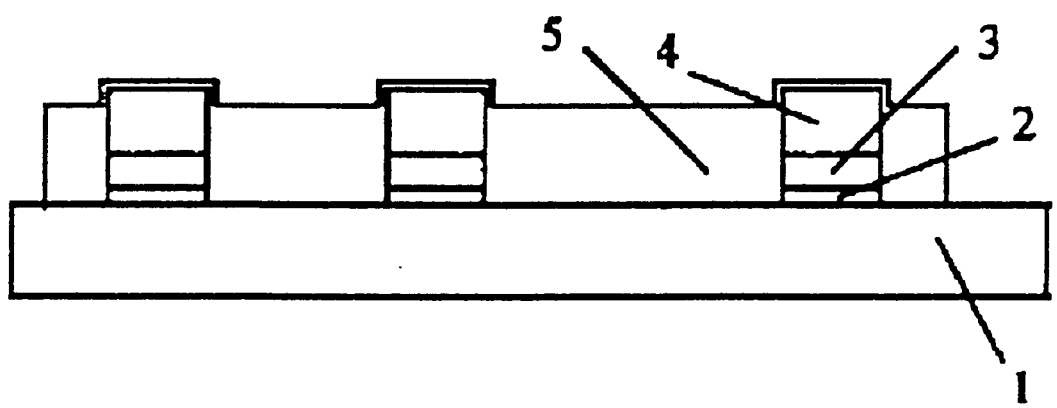

With reference to FIG. 3C, a scaling resin film 5 having both a photo-sensitivity and a thermosetting property is entirely applied on the supporting substrate 1 to cover the surface of the supporting substrate 1 and also cover the bumps 4 by use of any of the available methods using the roll coater, the curtain flow coater and the spin coater. A preferable thickness of the sealing resin film 5 may be in the range of 1 micrometer to 100 micrometers.

Figure 3D:
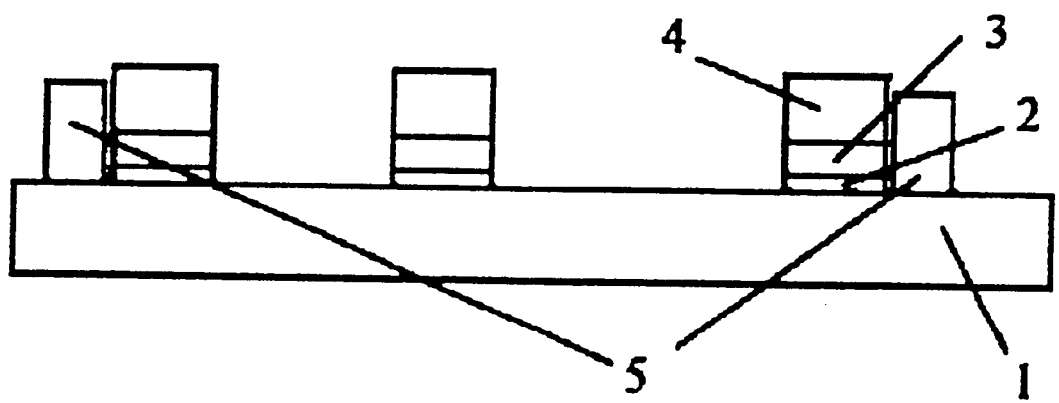

With reference to FIG. 3D, the sealing resin film 5 is then patterned by use of exposure and subsequent development so as to selectively remove the sealing resin film 5 so that the sealing resin film 5 remains only in the peripheral portion of the supporting substrate 1 and the bumps 4 are shown. The sealing resin 5 has a top surface lower than a top surface on the bumps 4.

Figure 3E:
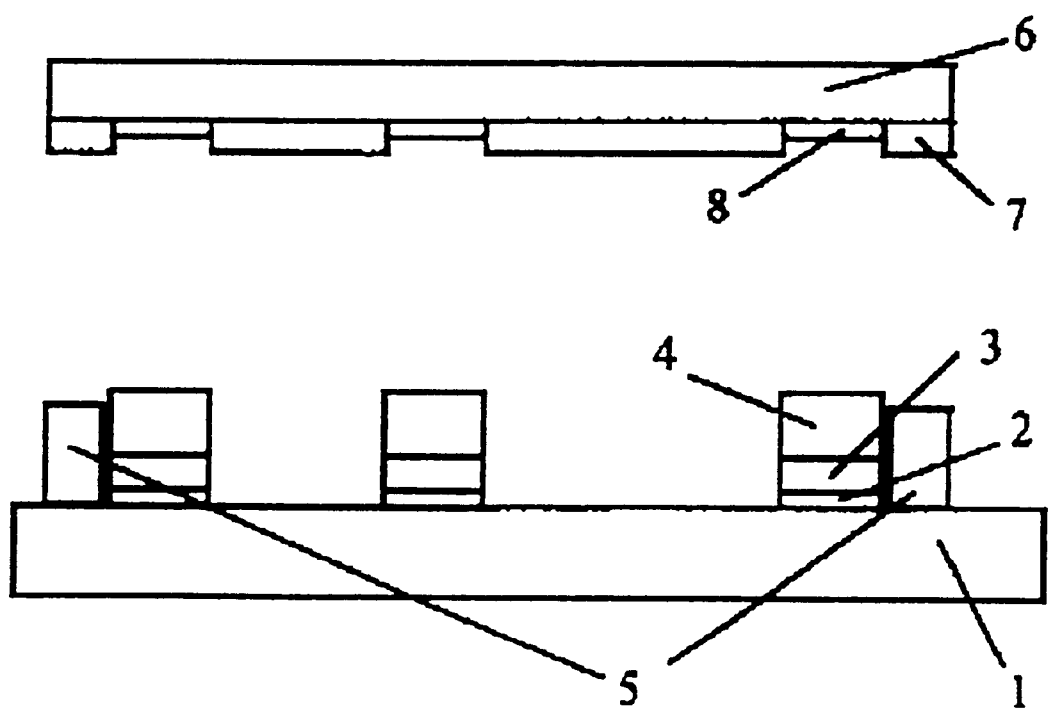
Figure 3F:
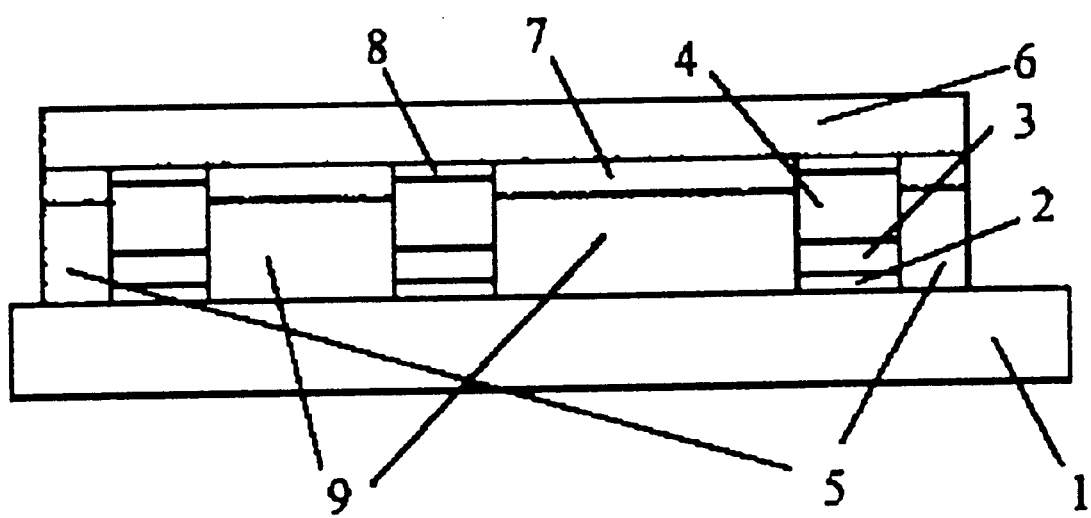

With reference to FIGS. 3E and 3F, there is carried out by use of a mounter a thermocompression bonding between the above supporting substrate already coated with the sealing resin film 5 and a semiconductor bare chip 6 which has already provided with electrode pads 8 and passivation films 7 so that the bumps 4 of the supporting substrate 1 are made into contact with the electrode pads 8 of the semiconductor bare chip 6. The passivation film 7 is thicker than the electrode pads 8 by a distance that is substantially the same as a distance the top surface of the sealing resin 5 is a lower than the top surface of the bumps 4. In the thermocompression bonding process, the bumps 4 are depressed by the heat given by the thermocompression bonding and also the sealing resin film 4 is made into contact with peripheral parts of the passivation films 7 and shows the thermosetting phenomenon due to that heat, whereby the sealing between the supporting substrate 1 and the semiconductor bare chip 6 is completed. Further, inner spaces 9 are formed between the supporting substrate 1 and the passivation film 7 of the semiconductor bare chip 6. The temperature of the thermocompression bonding process is adopted for the material of the sealing resin. Available temperature range may be 50° C.–500° C. A pressure of the thermocompression bonding process is determined to avoid that the bumps 4 are extensively depressed and widened to make adjacent two depressed bumps into contact with each other. In the above thermocompression bonding process, the sealing between the supporting substrate 1 and the semiconductor bare chip 6 is completed simultaneously to the bonding between the bumps 4 of the supporting substrate 1 and the electrode pads 4 of the semiconductor bare chip 6.

Third Embodiment

A third embodiment according to the present invention will be described in detail with reference to FIGS. 4A through 4E which are illustrative of a novel bonding method of a thermocompression bonding between a supporting substrate and a semiconductor bare chip. The supporting substrate 1 may, for example, be a printed circuit board, a flexible board, an organic tape board, a glass substrate and a ceramic substrate.

Figure 4A:
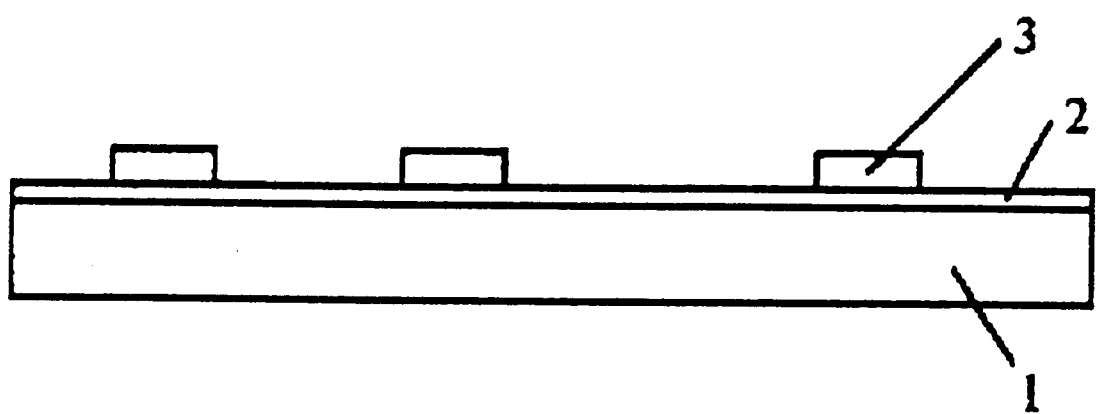
FIGS. 4A through 4E are illustrative of a novel bonding method of a thermocompression bonding between a supporting substrate and a semiconductor bare chip in a third embodiment in accordance with the present invention.

With reference to FIG. 4A, an electrically conductive thin film 2 is formed on an entire surface of the supporting substrate 1 by any available methods such as sputtering method and evaporation methods. A preferable thickness of the electrically conductive thin film 2 may be in the range of about 0.01 micrometer to about 0.1 micrometers. The electrically conductive thin film 2 may comprise laminations of a Ti layer and a Pd layer. Alternatively, the electrically conductive thin film 2 may comprise laminations of a Cr layer and a Pd layer. Further, alternatively, the electrically conductive thin film 2 may comprise laminations of a Cr layer and a Cu layer. A plated resist film is entirely formed on the electrically conductive thin film 2 by any available methods such as a roll coater, a curtain flow coater, a screen printing, and a spin coater. A preferable thickness of the plated resist film may be in the range of 1 micrometer to 100 micrometers. The plated resist film is patterned by exposure and subsequent development, thereby forming interconnection resist patterns over the electrically conductive thin film 2. By use of the interconnection resist patterns, an electroplating is conducted to selectively form metal interconnection layers on the electrically conductive thin film 2. A preferable thickness of the metal interconnection layers may be in the range of 1 micrometer to 100 micrometers. The metal interconnection layers may be made of any of metals such as Au, Ag or Cu. The plated resist film is then removed by a wet etching which uses a solvent such as MEK or alcohol whereby electrode pads 3 are selectively formed on the electrically conductive thin film 2.

If the printed circuit board, the ceramic substrate, the glass substrate or the semiconductor substrate which has already possessed the interconnections is used but any additional interconnection is required to be formed, then an electrically conductive thin film 2 is formed on an entire surface of the supporting substrate 1 by any available methods such as sputtering method and evaporation methods. A preferable thickness of the electrically conductive thin film 2 may be in the range of about 0.01 micrometer to about 0.1 micrometers, The electrically conductive thin film 2 may comprise laminations of a Ti layer and a Pd layer. Alternatively, the electrically conductive thin film 2 may comprise laminations of a Cr layer and a Pd layer. Further, alternatively, the electrically conductive thin film 2 may comprise laminations of a Cr layer and a Cu layer. A plated resist film is entirely formed on the electrically conductive thin film 2 by any available methods such as a roll coater, a curtain flow coater, a screen printing, and a spin coater A preferable thickness of the plated resist film may be in the range of 1 micrometer to 100 micrometers. The plated resist film is patterned by exposure and subsequent development, thereby forming interconnection resist patterns over the electrically conductive thin film 2. By use of the interconnection resist patterns, an electroplating is conducted to selectively form metal interconnection layers on the electrically conductive thin film 2. A preferable thickness of the metal interconnection layers may be in the range of 1 micrometer to 100 micrometers. The metal interconnection layers may be made of any of metals such as Au, Ag or Cu. The plated resist film is then removed by a wet etching which uses a solvent such as MEK or alcohol whereby electrode pads 3 are selectively formed on the electrically conductive thin film 2.

Figure 4B:
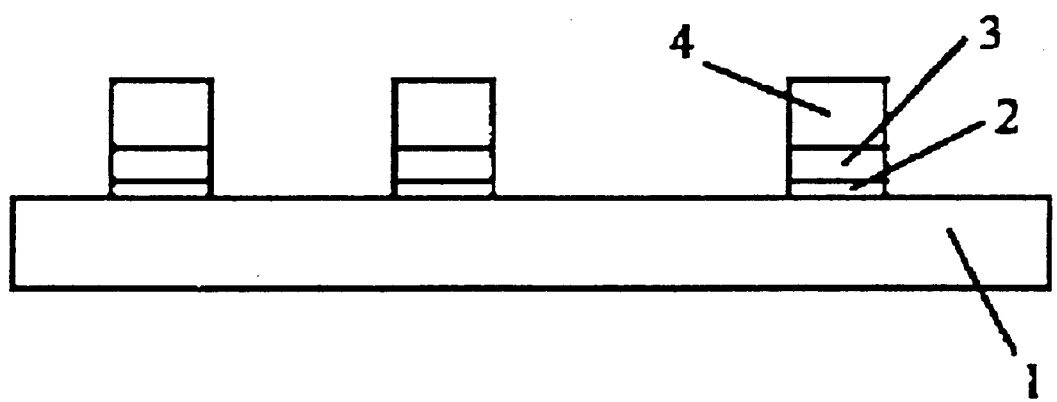

With reference to FIG. 4B, bumps 4 are formed on the electrode pads 3. The bumps 4 may be made of metals or alloys. The bumps 4 may comprise stud bumps, ball bumps, and plated bumps. In order to form Au plated bumps 4 over the electrode pads 3, a newly plated resist film is entirely applied on the substrate 1 to cover the electrode pads 3 and the electrically conductive thin film 2 by any available methods such as a roll coater, a curtain flow coater, a screen printing, and a spin coater. The newly plated resist film is patterned by exposure and subsequent development, thereby forming bump resist patterns. By use of the bump resist patterns, an electro-plating is conducted to selectively form the Au-plated bumps 4. The electro-plating may comprise the steps of a Ni-plating, an Au-strike plating and an Au-plating. It is also possible to form the Cu bumps or the Ag bumps in the same manners. The used bump resist patterns are then removed by the wet etching which uses a solvent such as MEK or alcohol. Further, the electrically conductive thin film 2 is selectively removed by the wet or dry etching process so that the electrically conductive thin film 2 remains only under the electrode pads 3.

Figure 4C:
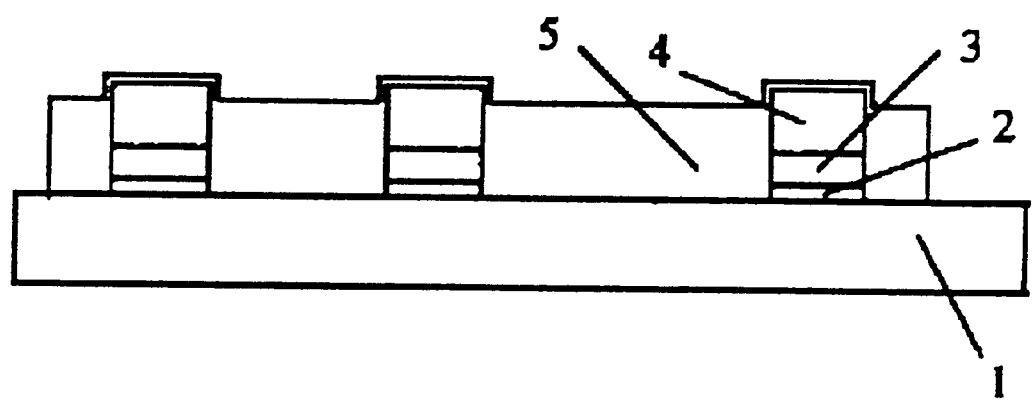

With reference to FIG. 4C, a scaling resin film 5 having both a photo-sensitivity and a thermosetting property is entirely applied on the supporting substrate 1 to cover the surface of the supporting substrate 1 and also cover the bumps 4 by use of any of the available methods using the roll coater, the curtain flow coater and the spin coater. A preferable thickness of the sealing resin film 5 may be in the range of 1 micrometer to 100 micrometers.

Figure 4D:
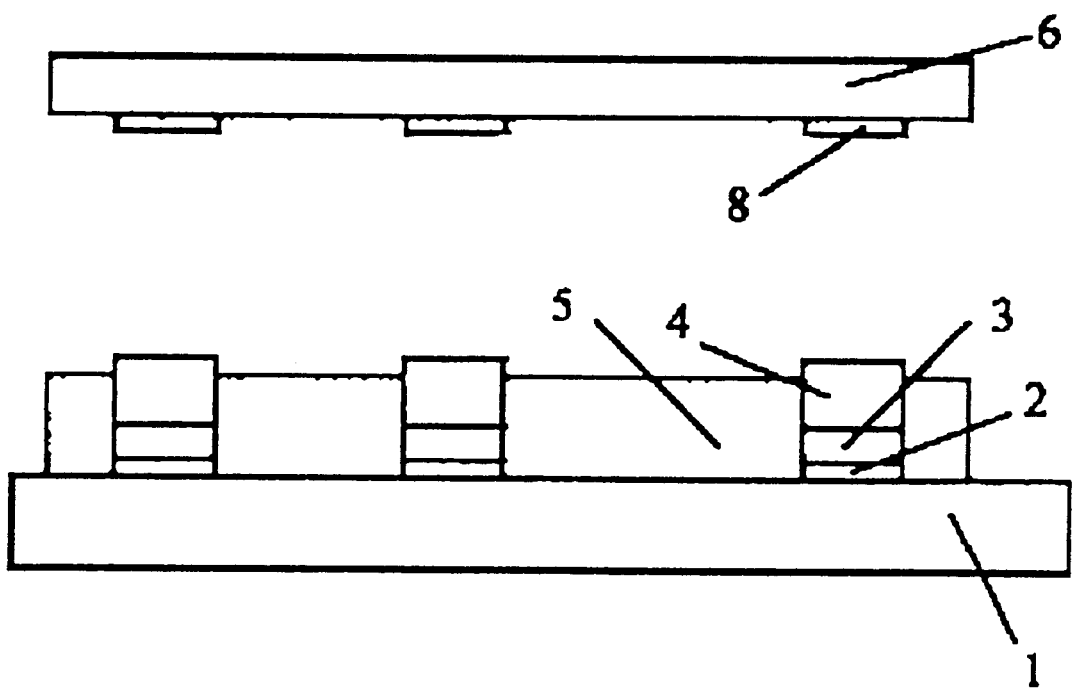

With reference to FIG. 4D, the sealing resin film 5 is then patterned by use of exposure and subsequent development so as to selectively remove the sealing resin film 5 only over the bumps 4 so that the tops of the bumps 4 are shown.

Figure 4E:
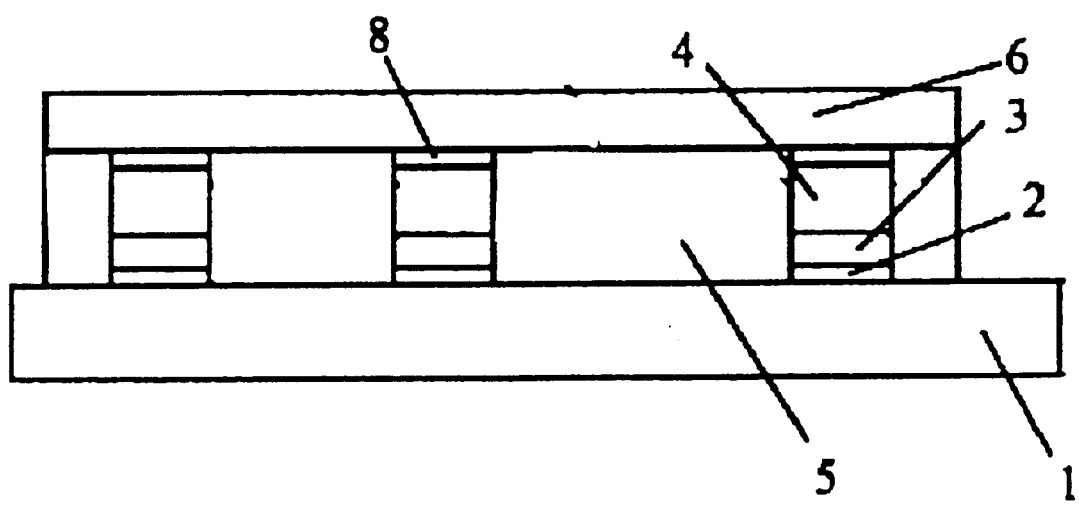

With reference to FIGS. 4D and 4E, there is carried out by use of a mounter a thermocompression bonding between the above supporting substrate already coated with the sealing resin film 5 and a semiconductor bare chip 6 which has already provided with electrode pads 8 and is free of passivation film so that the bumps 4 of the supporting substrate 1 are made into contact with the electrode pads 8 of the semiconductor bare chip 6. In the thermocompression bonding process, the bumps 4 are depressed by the heat given by the thermocompression bonding and also the sealing resin film 4 is made into contact with peripheral parts of the semiconductor bare chip 6 and shows the thermosetting phenomenon due to that heat, whereby the sealing between the supporting substrate 1 and the semiconductor bare chip 6 is completed. The temperature of the thermocompression bonding process is adopted for the material of the sealing resin. Available temperature range may be 50° C.–500° C. A pressure of the thermocompression bonding process is determined to avoid that the bumps 4 are extensively depressed and widen to make adjacent two depressed bumps into contact with each other. In the above thermocompression bonding process, the sealing between the supporting substrate 1 and the semiconductor bare chip 6 is completed simultaneously to the bonding between the bumps 4 of the supporting substrate 1 and the electrode pads 4 of the semiconductor bare chip 6.

Fourth Embodiment

A fourth embodiment according to the present invention will be described in detail with reference to FIGS. 5A through 5E which are illustrative of a novel bonding method of a thermocompression bonding between a supporting substrate and a semiconductor bare chip. The supporting substrate 1 may, for example, be a printed circuit board, a flexible board, an organic tape board, a glass substrate and a ceramic substrate.

Figure 5A:
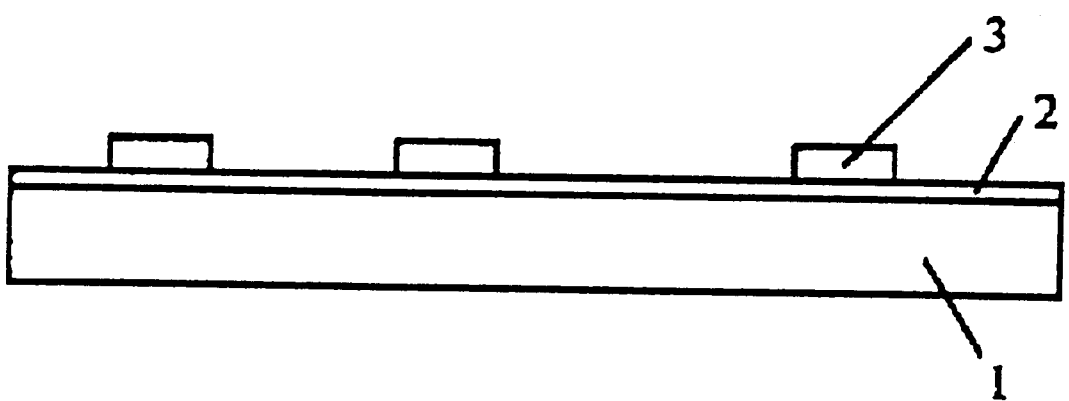
FIGS. 5A through 5F are illustrative of a novel bonding method of a thermocompression bonding between a supporting substrate and a semiconductor bare chip in a second embodiment in accordance with the present invention.

With reference to FIG. 5A, an electrically conductive thin film 2 is formed on an entire surface of the supporting substrate 1 by any available methods such as sputtering method and evaporation methods. A preferable thickness of the electrically conductive thin film 2 may be in the range of about 0.01 micrometer to about 0.1 micrometers. The electrically conductive thin film 2 may comprise laminations of a Ti layer and a Pd layer. Alternatively, the electrically conductive thin film 2 may comprise laminations of a Cr layer and a Pd layer. Further, alternatively, the electrically conductive thin film 2 may comprise laminations of a Cr layer and a Cu layer. A plated resist film is entirely formed on the electrically conductive thin film 2 by any available methods such as a roll coater, a curtain flow coater, a screen printing, and a spin coater. A preferable thickness of the plated resist film may be in the range of 1 micrometer to 100 micrometers. The plated resist film is patterned by exposure and subsequent development, thereby forming interconnection resist patterns over the electrically conductive thin film 2. By use of the interconnection resist patterns, an electro-plating is conducted to selectively form metal interconnection layers on the electrically conductive thin film 2. A preferable thickness of the metal interconnection layers may be in the range of 1 micrometer to 100 micrometers. The metal interconnection layers may be made of any of metals such as Au, Ag or Cu. The plated resist film is then removed by a wet etching which uses a solvent such as MEK or alcohol whereby electrode pads 3 are selectively formed on the electrically conductive thin film 2.

If the printed circuit board, the ceramic substrate, the glass substrate or the semiconductor substrate which has already possessed the interconnections is used but any additional interconnection is required to be formed, then an electrically conductive thin film 2 is formed on an entire surface of the supporting substrate 1 by any available methods such as sputtering method and evaporation methods. A preferable thickness of the electrically conductive thin film 2 may be in the range of about 0.01 micrometer to about 0.1 micrometers. The electrically conductive thin film 2 may comprise laminations of a Ti layer and a Pd layer. Alternatively, the electrically conductive thin film 2 may comprise laminations of a Cr layer and a Pd layer. Further, alternatively, the electrically conductive thin film 2 may comprise laminations of a Cr layer and a Cu layer. A plated resist film is entirely formed on the electrically conductive thin film 2 by any available methods such as a roll coater, a curtain flow coater, a screen printing, and a spin coater. A preferable thickness of the plated resist film may be in the range of 1 micrometer to 100 micrometers. The plated resist film is patterned by exposure and subsequent development, thereby forming interconnection resist patterns over the electrically conductive thin film 2. By use of the interconnection resist patterns, an electro-plating is conducted to selectively form metal interconnection layers on the electrically conductive thin film 2. A preferable thickness of the metal interconnection layers may be in the range of 1 micrometer to 100 micrometers. The metal interconnection layers may be made of any of metals such as Au, Ag or Cu. The plated resist film is then removed by a wet etching which uses a solvent such as MEK or alcohol whereby electrode pads 3 are selectively formed on the electrically conductive thin film 2.

Figure 5B:
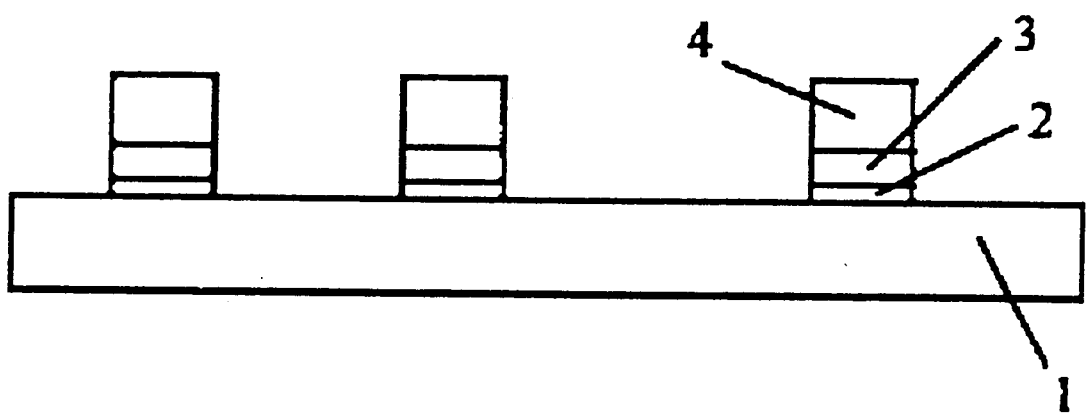

With reference to FIG. 5B, bumps 4 are formed on the electrode pads 3. The bumps 4 may be made of metals or alloys. The bumps 4 may comprise stud bumps, ball bumps, and plated bumps. In order to form Au plated bumps 4 over the electrode pads 3, a newly plated resist film is entirely applied on the substrate 1 to cover the electrode pads 3 and the electrically conductive thin film 2 by any available methods such as a roll coater, a curtain flow coater, a screen printing, and a spin coater. The newly plated resist film is patterned by exposure and subsequent development, thereby forming bump resist patterns. By use of the bump resist patterns, an electro-plating is conducted to selectively form the Au-plated bumps 4. The electro-plating may comprise the steps of a Ni-plating, an Au-strike plating and an Au-plating. It is also possible to form the Cu bumps or the Ag bumps in the same manners. The used bump resist patterns are then removed by the wet etching which uses a solvent such as MEK or alcohol. Further, the electrically conductive thin film 2 is selectively removed by the wet or dry etching process so that the electrically conductive thin film 2 remains only under the electrode pads 3.

Figure 5C:
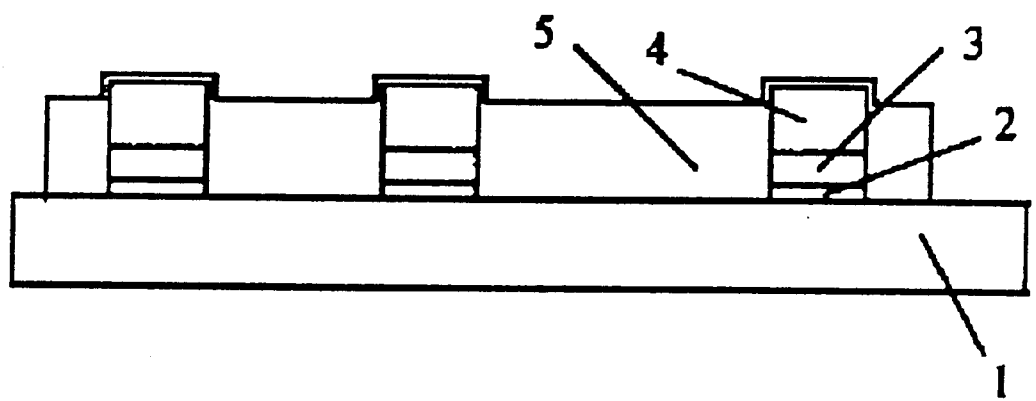

With reference to FIG. 5C, a sealing resin film 5 having both a photo-sensitivity and a thermosetting property is entirely applied on the supporting substrate 1 to cover the surface of the supporting substrate 1 and also cover the bumps 4 by use of any of the available methods using the roll coater, the curtain flow coater and the spin coater. A preferable thickness of the sealing resin film 5 may be in the range of 1 micrometer to 100 micrometers.

Figure 5D:
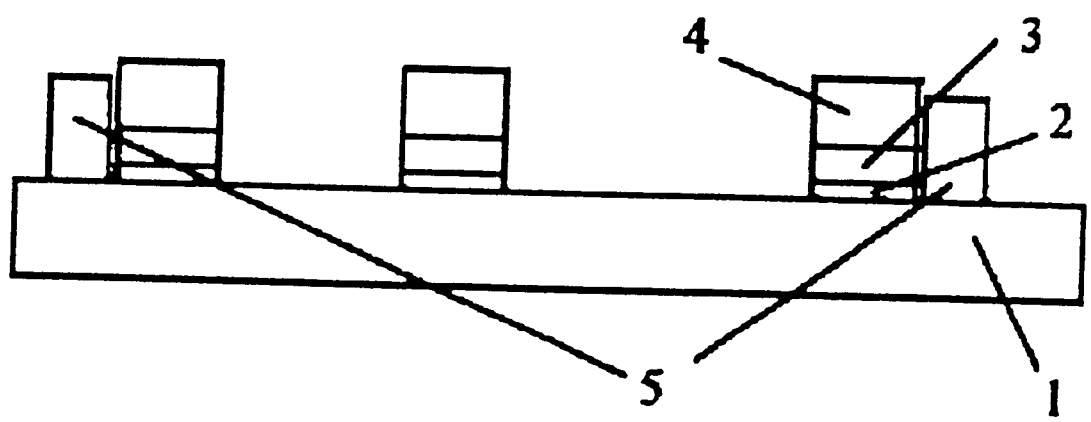

With reference to FIG. 5D, the sealing resin film 5 is then patterned by use of exposure and subsequent development so as to selectively remove the sealing resin film 5 so that the sealing resin film 5 remains only in the peripheral portion of the supporting substrate 1 and the bumps 4 are shown.

Figure 5E:
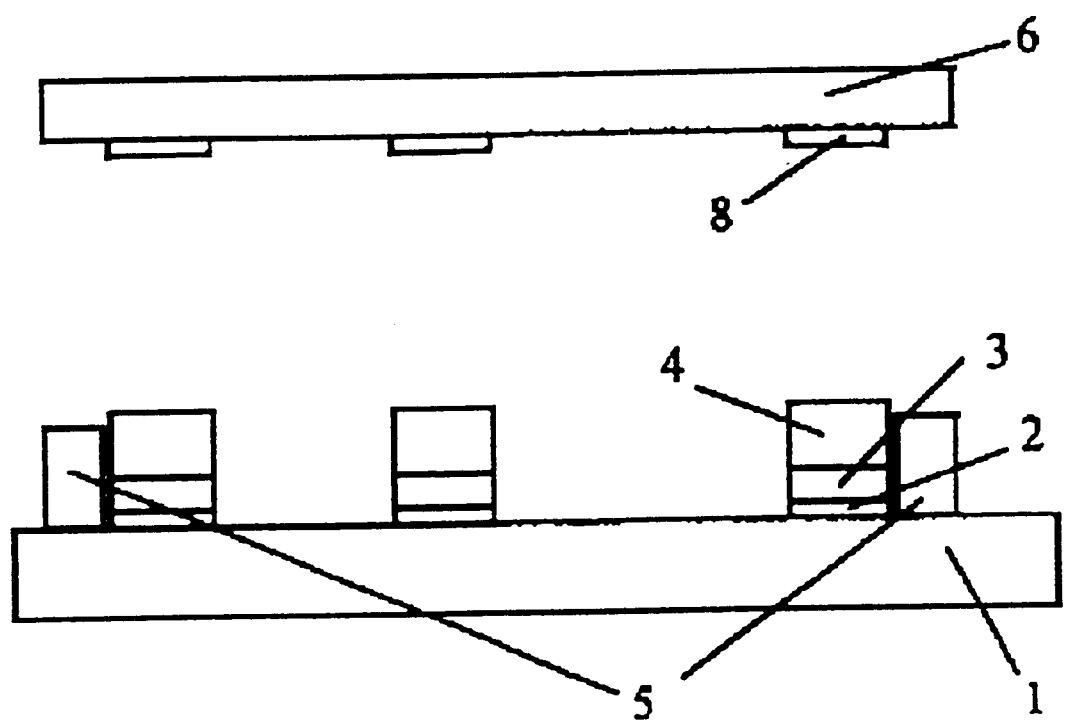
Figure 5F:
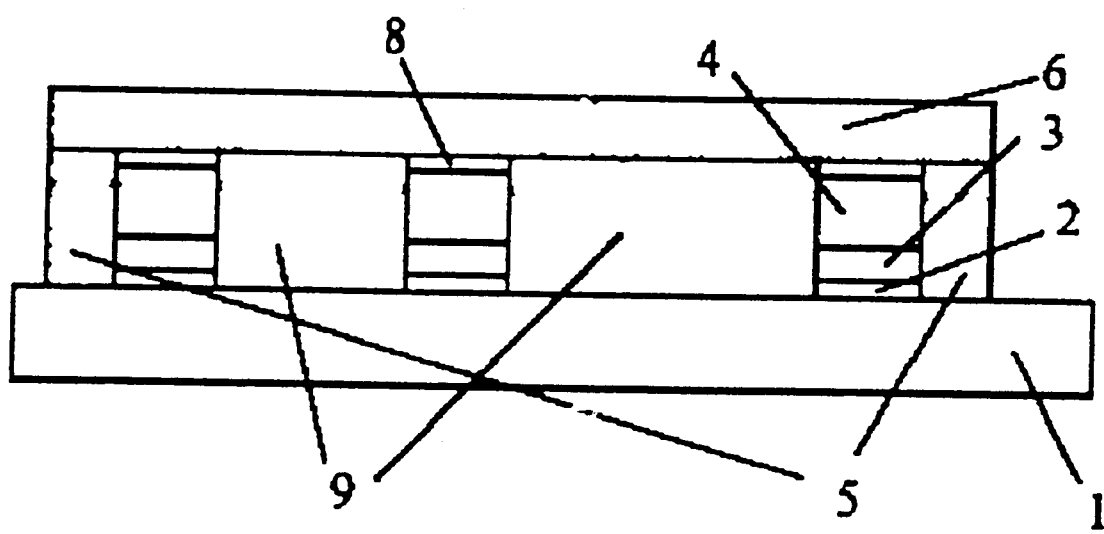

With reference to FIGS. 5E and 5F, there is carried out by use of a mounter a thermocompression bonding between the above supporting substrate already coated with the sealing resin film 5 and a semiconductor bare chip 6 which has already provided with electrode pads 8 and is free of passivation film so that the bumps 4 of the supporting substrate 1 are made into contact with the electrode pads 8 of the semiconductor bare chip 6. In the thermocompression bonding process, the bumps 4 are depressed by the heat given by the thermocompression bonding and also the sealing resin film 4 is made into contact with semiconductor bare chip 6 and shows the thermosetting phenomenon due to that heat, whereby the sealing between the supporting substrate 1 and the semiconductor bare chip 6 is completed. Further, inner spaces 9 are formed between the supporting substrate 1 and the semiconductor bare chip 6. The temperature of the thermocompression bonding process is adopted for the material of the sealing resin. Available temperature range may be 50° C.–500° C. A pressure of the thermocompression bonding process is determined to avoid that the bumps 4 are extensively depressed and widen to make adjacent two depressed bumps into contact with each other. In the above thermocompression bonding process, the sealing between the supporting substrate 1 and the semiconductor bare chip 6 is completed simultaneously to the bonding between the bumps 4 of the supporting substrate 1 and the electrode pads 4 of the semiconductor bare chip 6.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device comprising:

a semiconductor bare chip with first electrode pads thereon;

a supporting substrate with second electrode pads on a surface of said supporting substrate and electrically conductive bumps on said second electrode pads, said bumps being bonded to said first electrode pads;

a thermosetting sealing resin on the periphery of said surface does not cover said bumps and a central portion of said surface, said thermosetting sealing resin having a top surface that is lower than a top surface of said electrically conductive bumps; and a passivation film on said semiconductive bare chip that leaves uncovered said first electrode pads and that is thicker than said first electrode pads by a distance that is substantially the same as a distance the top surface of the sealing resin is lower than the top surface of the electrically conductive bumps.

2. The semiconductor device as claimed in claim 1, wherein said sealing resin comprises:

an activation energy ray thermosetting resin which exhibits a thermosetting phenomenon by irradiation of an activation energy ray having an activation energy;

an activation energy ray polymerization initiator which generates radicals by irradiation of said activation energy ray;

a diluent; and a thermosetting compound having an epoxy group.

3. The semiconductor device as claimed in claim 2, wherein said activation energy ray includes at least any of ultraviolet rays, electron beams and X-rays.

4. The semiconductor device as claimed in claim 2, wherein said activation energy ray thermosetting resin comprises an epoxy resin having a fluorene skeleton structure.

5. The semiconductor device as claimed in claim 2, wherein said activation energy ray thermosetting resin comprises an epoxyacrylate resin having a fluorenyl group skeleton structure.

6. The semiconductor device as claimed in claim 2, wherein said activation energy ray polymerization initiator is present at a ratio in the range of 3–20% by weight to said activation energy ray thermosetting resin.

7. The semiconductor device as claimed in claim 2, wherein said diluent is present at a ratio in the range of 10–60% by weight to said activation energy ray thermosetting resin.

8. The semiconductor device as claimed in claim 7, wherein said diluent is present at a ratio in the range of 20–40% by weight to said activation energy ray thermosetting resin.

9. The semiconductor device as claimed in claim 2, wherein said thermosetting compound is present at a ratio in the range of 5–40% by weight to said activation energy ray thermosetting resin.

10. The semiconductor device as claimed in claim 9, wherein said thermosetting compound is present at a ratio in the range of 10–30% by weight to said activation energy ray thermosetting resin.

11. The semiconductor device as claimed in claim 1, wherein said sealing resin is photosensitive.

12. The semiconductor device as claimed in claim 1, wherein a plurality of said electrode pads are peripheral electrode pads on a periphery of said surface, and wherein said central portion encompasses a space interior to said peripheral electrode pads.

* * * * *